US 010916554B2

(12) United States Patent
Shin et al.

(10) Patent No.: US 10,916,554 B2
(45) Date of Patent: Feb. 9, 2021

(54) THREE-DIMENSIONAL SEMICONDUCTOR MEMORY DEVICE

(71) Applicant: SAMSUNG ELECTRONICS CO., LTD., Suwon-si (KR)

(72) Inventors: Miso Shin, Seoul (KR); Myeongan Kwon, Hwaseong-si (KR); Chungki Min, Hwaseong-si (KR); Byoungho Kwon, Hwaseong-si (KR); Boun Yoon, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/793,301

(22) Filed: Feb. 18, 2020

(65) Prior Publication Data

US 2020/0185398 A1 Jun. 11, 2020

Related U.S. Application Data

(63) Continuation of application No. 15/922,186, filed on Mar. 15, 2018, now Pat. No. 10,566,338.

(30) Foreign Application Priority Data

Sep. 1, 2017 (KR) .................... 10-2017-0112028

(51) Int. Cl.
*H01L 27/11548* (2017.01)
*H01L 27/11556* (2017.01)
(Continued)

(52) U.S. Cl.
CPC .... *H01L 27/11556* (2013.01); *H01L 27/1157* (2013.01); *H01L 27/11519* (2013.01);
(Continued)

(58) Field of Classification Search
CPC ......... H01L 27/11578; H01L 27/11548; H01L 27/11575; H01L 27/11529
See application file for complete search history.

(56) References Cited

U.S. PATENT DOCUMENTS 6,348,415 B1    2/2002  Lee et al.
2008/0242084 A1  10/2008  Kim et al.
(Continued)

FOREIGN PATENT DOCUMENTS

JP      2000-036533 A     2/2000
KR  10-2001-0097949 A    11/2001
(Continued)

*Primary Examiner* — Grant S Withers
(74) *Attorney, Agent, or Firm* — Lee IP Law, PC

(57) ABSTRACT

Provided are a three-dimensional semiconductor memory device and a method of fabricating the same. The device may include a substrate including a peripheral circuit region and a cell array region, peripheral gate stacks provided on the peripheral circuit region of the substrate, and an electrode structure provided on the cell array region of the substrate. The electrode structure may include a lower electrode, a lower insulating layer covering the lower electrode, and upper electrodes and upper insulating layers, which are vertically and alternately stacked on the lower insulating layer. The lower insulating layer may be extended from the cell array region to the peripheral circuit region to cover the peripheral gate stacks, and a top surface of the lower insulating layer may be higher on the peripheral circuit region than on the cell array region.

20 Claims, 27 Drawing Sheets

(51) Int. Cl.
*H01L 27/11519* (2017.01)
*H01L 27/11529* (2017.01)
*H01L 27/11565* (2017.01)
*H01L 27/1157* (2017.01)
*H01L 27/11573* (2017.01)
*H01L 27/11575* (2017.01)
*H01L 27/11582* (2017.01)

(52) U.S. Cl.
CPC .. *H01L 27/11529* (2013.01); *H01L 27/11548* (2013.01); *H01L 27/11565* (2013.01); *H01L 27/11573* (2013.01); *H01L 27/11575* (2013.01); *H01L 27/11582* (2013.01)

(56) References Cited

U.S. PATENT DOCUMENTS

| | | |
|---|---|---|
| 2012/0070944 A1 | 3/2012 | Kim et al. |
| 2012/0108048 A1 | 5/2012 | Lim et al. |
| 2012/0211823 A1 | 8/2012 | Lim et al. |
| 2015/0162343 A1 | 6/2015 | Park et al. |
| 2015/0340374 A1 | 11/2015 | Jung et al. |
| 2015/0372004 A1 | 12/2015 | Jung et al. |
| 2016/0027796 A1 | 1/2016 | Yang et al. |
| 2016/0049423 A1 | 2/2016 | Yoo et al. |
| 2016/0163686 A1 | 6/2016 | Lee et al. |
| 2016/0225785 A1 | 8/2016 | Kim et al. |
| 2016/0293625 A1 | 10/2016 | Kang et al. |
| 2017/0179154 A1 | 6/2017 | Furihata |
| 2017/0236746 A1 | 8/2017 | Yu et al. |
| 2018/0090512 A1 | 3/2018 | Kim et al. |
| 2018/0166454 A1 | 6/2018 | Pyon et al. |
| 2018/0294225 A1 | 10/2018 | Lee et al. |
| 2019/0244970 A1* | 8/2019 | Jung ................. H01L 27/11565 |

FOREIGN PATENT DOCUMENTS

| | | |
|---|---|---|
| KR | 10-0668836 B1 | 1/2007 |
| KR | 10-2012-0030193 A | 3/2012 |

\* cited by examiner

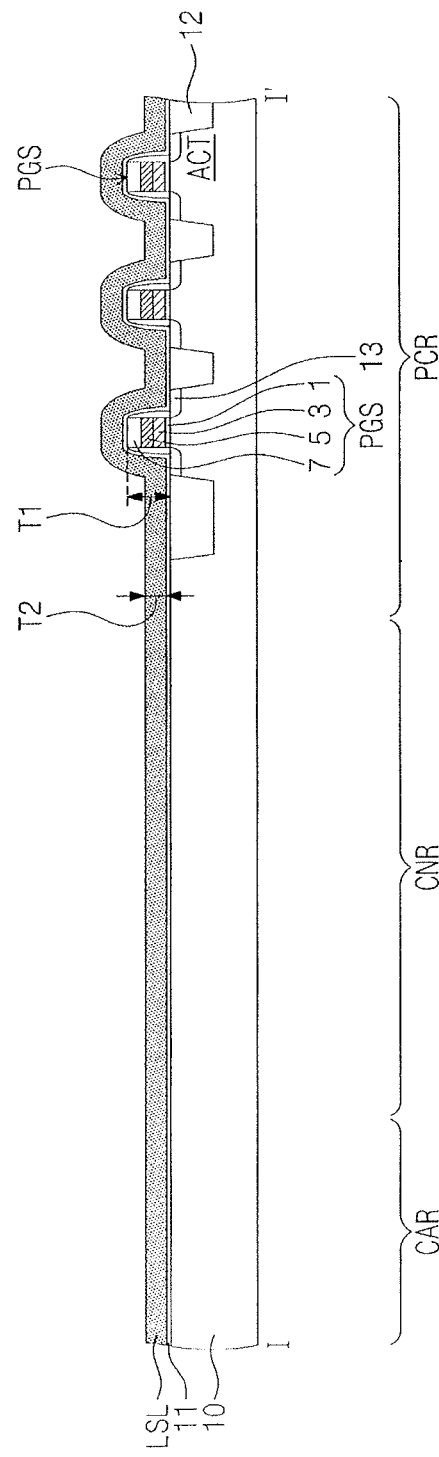
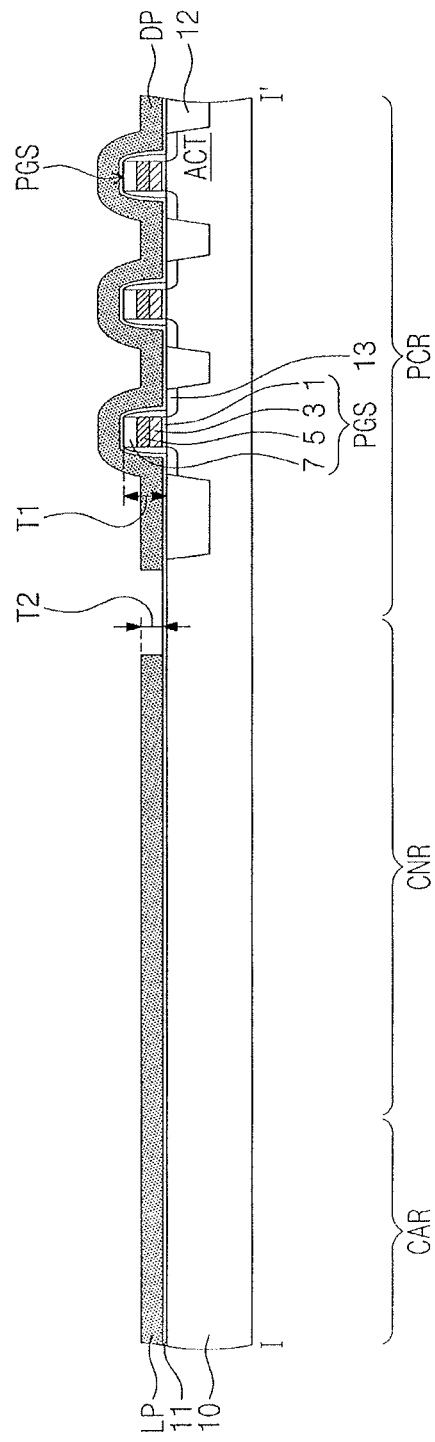

THREE-DIMENSIONAL SEMICONDUCTOR MEMORY DEVICE

CROSS-REFERENCE TO RELATED APPLICATIONS

This is a continuation application based on pending application Ser. No. 15/922,186, filed Mar. 15, 2018, the entire contents of which is hereby incorporated by reference.

Korean Patent Application No. 10-2017-0112028, filed on Sep. 1, 2017, in the Korean Intellectual Property Office, and entitled: "Three-Dimensional Semiconductor Memory Device and Method of Fabricating the Same," is incorporated by reference herein in its entirety.

BACKGROUND

1. Field

Embodiments relate to a three-dimensional semiconductor memory device and a method of fabricating the same.

2. Description of the Related Art

Higher integration of semiconductor devices is pursued to satisfy consumer demands for superior performance and inexpensive prices. In the case of semiconductor devices, since their integration is an important factor in determining product prices, increased integration is especially desirable.

SUMMARY

Embodiments are directed to a three-dimensional semiconductor memory device, which may include a substrate including a peripheral circuit region and a cell array region, peripheral gate stacks provided on the peripheral circuit region of the substrate, and an electrode structure provided on the cell array region of the substrate. The electrode structure may include a lower electrode, a lower insulating layer covering the lower electrode, and upper electrodes and upper insulating layers, which are vertically and alternately stacked on the lower insulating layer. The lower insulating layer may be extended from the cell array region to the peripheral circuit region to cover the peripheral gate stacks, and a top surface of the lower insulating layer may be higher on the peripheral circuit region than on the cell array region.

Embodiments are also directed to a three-dimensional semiconductor memory device, which may include a substrate including a peripheral circuit region and a cell array region, peripheral gate stacks provided on the peripheral circuit region of the substrate, a lower electrode provided on the cell array region of the substrate, a lower insulating layer covering the lower electrode and the peripheral gate stacks, and an electrode structure on the cell array region. The electrode structure may include upper electrodes and upper insulating layers, which are vertically and alternately stacked on the lower insulating layer. The lower insulating layer may include a flat portion, which is provided on the cell array region to cover the lower electrode and to have a uniform first thickness, and upwardly convex portions, which are provided on the peripheral circuit region to cover the peripheral gate stacks.

Embodiments are also directed to a method of fabricating a three-dimensional semiconductor memory device, which may include providing a substrate including a peripheral circuit region and a cell array region, forming peripheral gate stacks on the peripheral circuit region of the substrate, forming a lower sacrificial pattern on the cell array region of the substrate, forming a lower insulating layer to cover the lower sacrificial pattern and the peripheral gate stacks, the lower insulating layer including a flat portion covering the lower sacrificial pattern and protruding portions on the peripheral gate stacks, forming a mold structure on the flat portion of the lower insulating layer, the mold structure including upper sacrificial layers and upper insulating layers which are vertically and alternately stacked on the lower insulating layer, forming an upper insulating gapfill layer to cover the protruding portions of the lower insulating layer and the mold structure, and performing a replacement process on the cell array region to replace a portion of the lower sacrificial pattern with a lower electrode and to replace the upper sacrificial layers with upper electrodes.

BRIEF DESCRIPTION OF THE DRAWINGS

Features will become apparent to those of skill in the art by describing in detail example embodiments with reference to the attached drawings in which:

FIGS. 15 to 28 illustrate sectional views illustrating a method of fabricating a three-dimensional semiconductor memory device according to an example embodiment, taken along line I-I' of FIG. 3.

Figure 1:
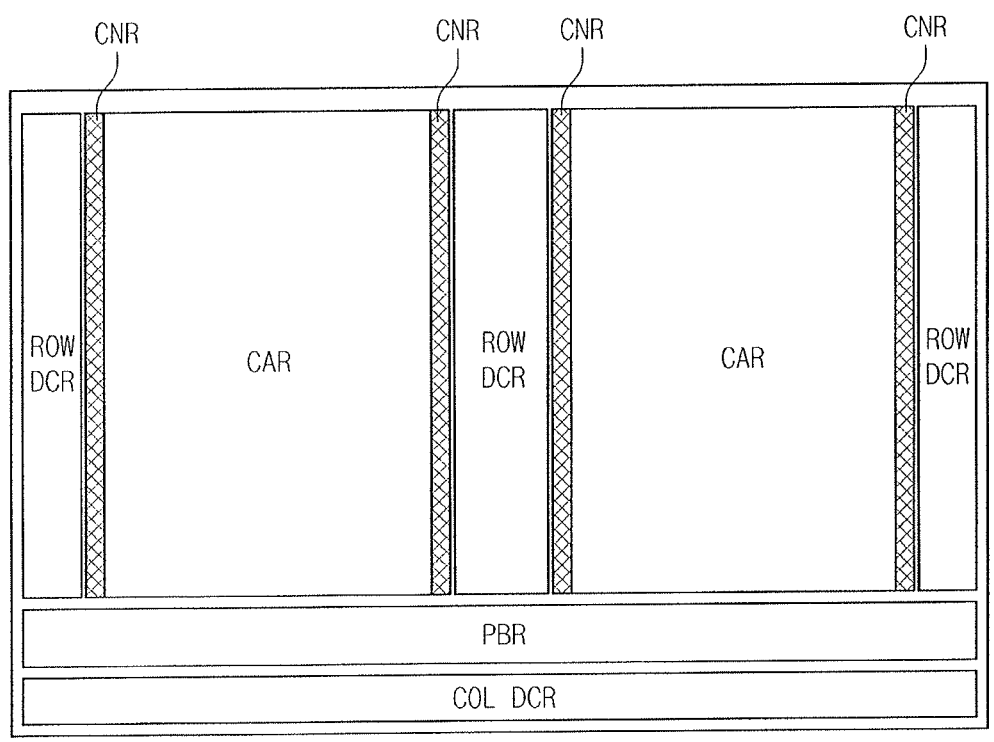
FIG. 1 illustrates a plan view illustrating a schematic configuration of a three-dimensional semiconductor memory device according to an example embodiment.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

FIG. 1 is a plan view illustrating a schematic configuration of a three-dimensional semiconductor memory device according to an example embodiment.

Referring to FIG. 1, a three-dimensional semiconductor memory device may include a cell array region CAR and a peripheral circuit region. The peripheral circuit region may include, for example, row decoder regions ROW DCR, a page buffer region PBR, a column decoder region COL DCR, a control circuit region, etc. In some embodiments, a connection region CNR may be provided between the cell array region CAR and each of the row decoder regions ROW DCR.

A memory cell array including a plurality of memory cells may be provided in the cell array region CAR. In some embodiments, the memory cell array may include a plurality of memory cells, which are three-dimensionally arranged, for example, stacked, in the memory cell array, and a plurality of word and bit lines, which are electrically connected to the memory cells.

In each of the row decoder regions ROW DCR, a row decoder may be provided to select at least one of the word lines that are provided in the memory cell array, and in the connection region CNR, an interconnection structure may be provided to electrically connect the memory cell array to the row decoder. In the page buffer region PBR, a page buffer may be provided to read out data stored in the memory cells. A column decoder may be provided in the column decoder region COL DCR and may be connected to the bit lines of the memory cell array.

Figure 2:
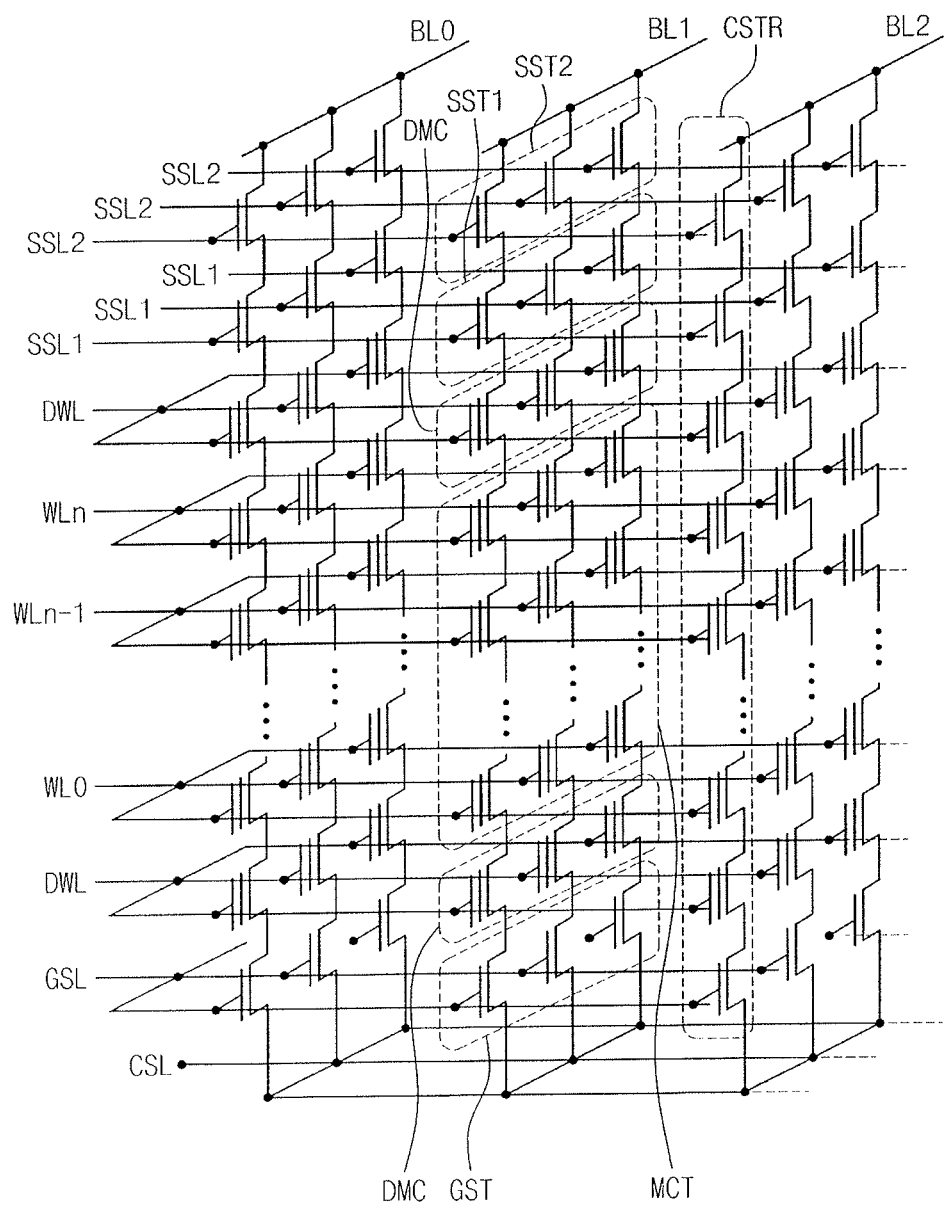
FIG. 2 illustrates a circuit diagram of a three-dimensional semiconductor memory device according to an example embodiment.

FIG. 2 is a circuit diagram of a memory cell array of a three-dimensional semiconductor memory device according to an example embodiment.

Referring to FIG. 2, a three-dimensional semiconductor memory device according to an example embodiment may include a cell array, in which a common source line CSL, a plurality of bit lines BL0-BL2, and a plurality of cell strings CSTR therebetween are provided.

The bit lines BL0-BL2 may be two-dimensionally arranged, and a plurality of cell strings CSTR may be connected in parallel to each of the bit lines BL0-BL2. The plurality of cell strings CSTR may be connected in common to the common source line CSL. Thus, a plurality of cell strings CSTR may be provided between the bit lines BL0-BL2 and the common source line CSL. In some embodiments, a plurality of common source lines CSL may be two-dimensionally arranged. The common source lines CSL may be applied with the same voltage or may be independently controlled.

In some embodiments, each of the cell strings CSTR may include a plurality of string selection transistors SST1 and SST2, which are connected in series to each other, memory cell transistors MCT, which are connected in series to each other, and a ground selection transistor GST. Each of the memory cell transistors MCT may include a data storage element. As an example, each of the cell strings CSTR may include first and second string selection transistors SST1 and SST2, the second string selection transistor SST2 may be coupled to the bit lines BL0-BL2, and the ground selection transistor GST may be coupled to the common source line CSL. The memory cell transistors MCT may be provided between the first string selection transistor SST1 and the ground selection transistor GST and may be connected in series to each other. Furthermore, each of the cell strings CSTR may further include a dummy cell transistor DMC that is provided between the first string selection transistor SST1 and the memory cell transistor MCT to connect them to each other. The dummy cell transistor DMC may be provided between the ground selection transistor GST and the memory cell transistor MCT to connect them to each other.

As another example, in each of the cell strings CSTR, the ground selection transistor GST may include a plurality of metal-oxide-semiconductor (MOS) transistors, which are connected in series to each other, similar to the string selection transistors SST1 and SST2. In addition, each of the cell strings CSTR may be configured to have a single string selection transistor.

The first string selection transistor SST1 may be controlled by a first string selection line SSL1, and the second string selection transistor SST2 may be controlled by a second string selection line SSL2. The memory cell transistors MCT may be controlled by a plurality of word lines WL0-WLn, and the dummy cell transistors DMC may be controlled by a dummy word line DWL. The ground selection transistor GST may be controlled by a ground selection line GSL. The common source line CSL may be connected in common to sources of the ground selection transistors GST.

In addition, gate electrodes of the memory cell transistors MCT, which are disposed at the substantially same height from the common source lines CSL, may be connected in common to one of the word lines WL0-WLn, thereby being in an equipotential state. In another implementation, although the gate electrodes of the memory cell transistors MCT are disposed at the substantially same height from the common source lines CSL, some of them (for example, disposed in different row or column) may be independently controlled.

Figure 3:
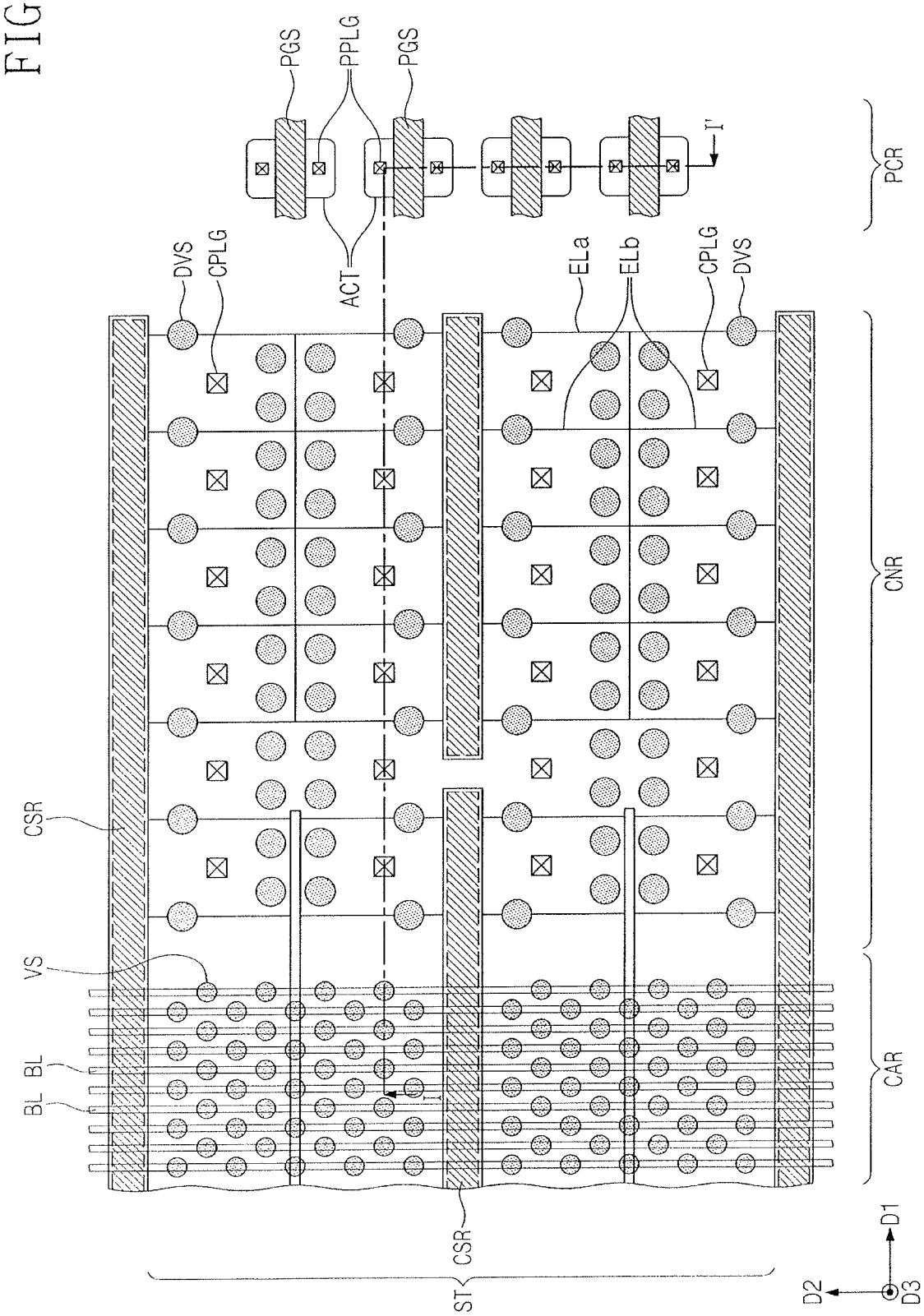
FIG. 3 illustrates a plan view illustrating a three-dimensional semiconductor memory device according to an example embodiment.
Figure 4:
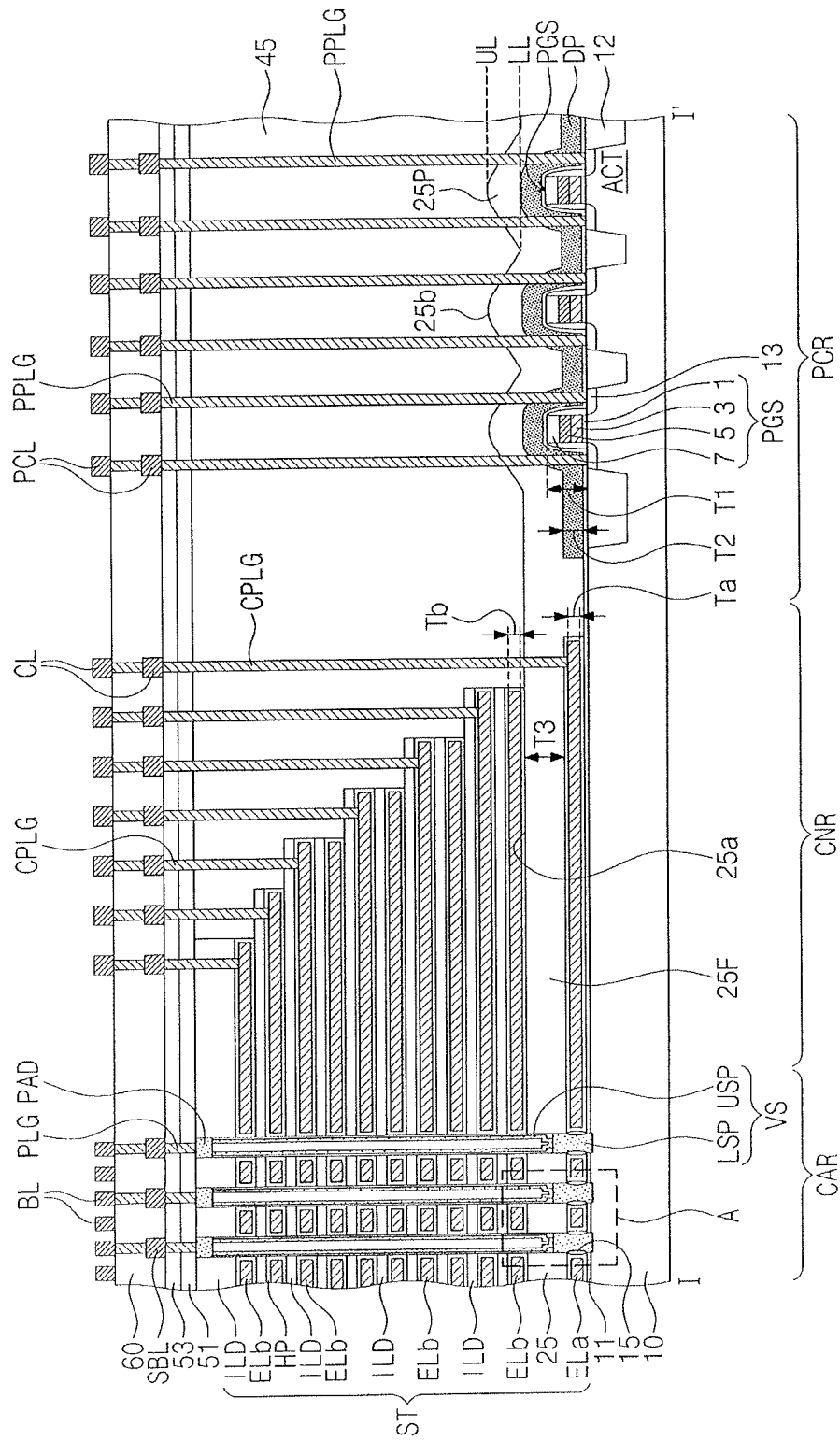
FIG. 4 illustrates a sectional view illustrating a three-dimensional semiconductor memory device according to an example embodiment, taken along line I-I' of FIG. 3.
Figure 5A:
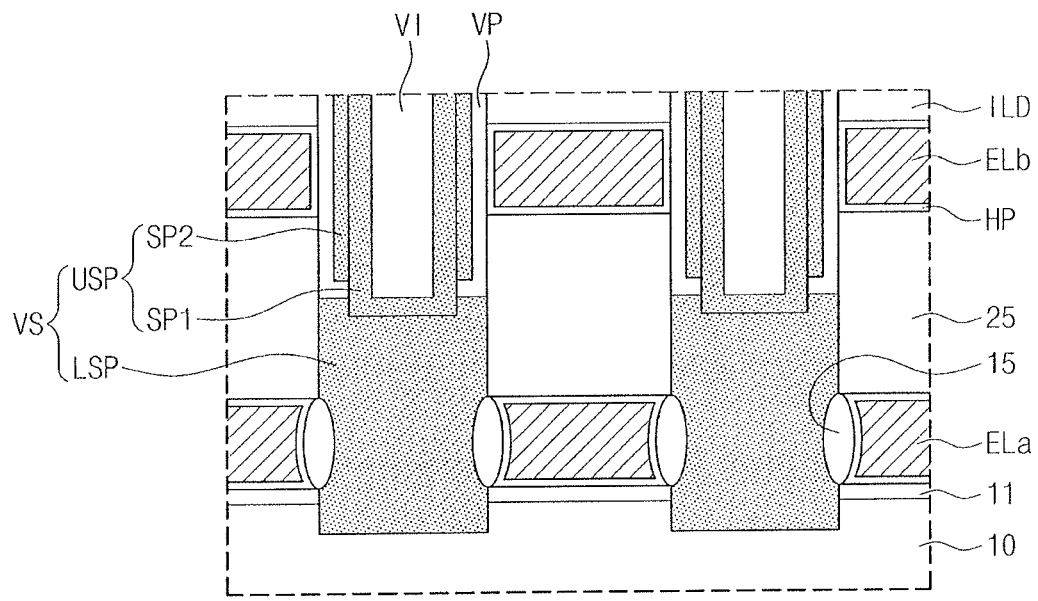
FIGS. 5A and 5B illustrate sectional views, each of which illustrates a portion of a three-dimensional semiconductor memory device according to an example embodiment, corresponding to a portion 'A' of FIG. 4.
Figure 5B:
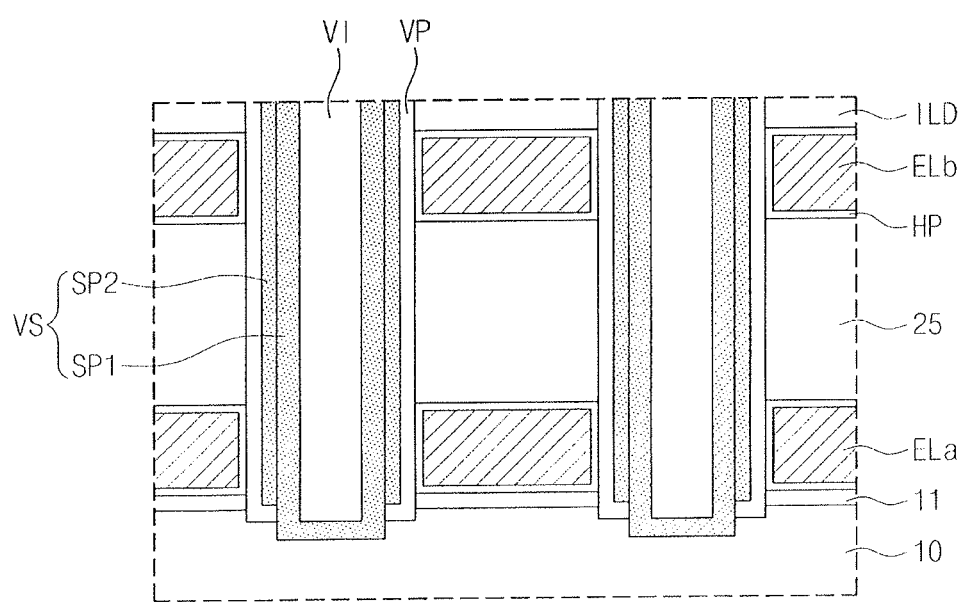

FIG. 3 is a plan view illustrating a three-dimensional semiconductor memory device according to an example embodiment. FIG. 4 is a sectional view illustrating a three-dimensional semiconductor memory device according to an example embodiment, taken along line I-I' of FIG. 3. FIGS. 5A and 5B are sectional views, each of which illustrates a portion of a three-dimensional semiconductor memory device according to an example embodiment, corresponding to a portion 'A' of FIG. 4.

Referring to FIGS. 3 and 4, a substrate 10 may include a cell array region CAR, a connection region CNR, and a peripheral circuit region PCR. The connection region CNR may be positioned between the cell array region CAR and the peripheral circuit region PCR. The substrate 10 may include, for example, a semiconductor material (for example, silicon), an insulating material (for example, glass), or a semiconductor or conductive material covered with an insulating material. For example, the substrate 10 may be a silicon wafer, which is of a first conductivity type.

A peripheral circuit structure may be provided on the peripheral circuit region PCR of the substrate 10, and the peripheral circuit structure may include row and column decoders, a page buffer, and control circuits. The peripheral circuit structure may include, for example, high- or low voltage transistors, resistors, and capacitors.

As shown in FIG. 4, a device isolation layer 12 may be formed in the peripheral circuit region PCR of the substrate 10 to define active regions ACT. The peripheral circuit structure may include peripheral gate stacks PGS, which are provided on the peripheral circuit region PCR of the substrate 10, and source and drain impurity regions 13, which are provided at both sides of each of the peripheral gate stacks PGS.

The peripheral gate stacks PGS may be spaced apart from each other on the peripheral circuit region PCR of the substrate 10 and may be provided to cross the active regions ACT defined in the peripheral circuit region PCR of the substrate 10. Each of the peripheral gate stacks PGS may include, for example, a peripheral gate insulating layer 1, a doped poly-silicon layer 3, a gate metal layer 5, and a hard mask layer 7, which are sequentially stacked on the substrate 10. Spacers may be provided to cover both side walls of each of the peripheral gate stacks PGS. In some embodiments, the peripheral gate stacks PGS may have a first thickness T1, which is equal to a distance from a top surface of the substrate 10 to top surfaces of the peripheral gate stacks PGS.

A dummy sacrificial pattern DP may be provided on the peripheral circuit region PCR to conformally cover the peripheral gate stacks PGS and the top surface of the substrate 10. The dummy sacrificial pattern DP may have a second thickness T2, which is less than the first thickness T1 of the peripheral gate stack PGS. In some embodiments, the dummy sacrificial pattern DP may be formed of or include a silicon nitride layer.

An electrode structure ST may be provided on the cell array region CAR of the substrate 10 and may be spaced apart from the peripheral circuit structure. The electrode structure ST may extend from the cell array region CAR to the connection region CNR or in a first direction D1 and may have a staircase structure on the connection region CNR. A buffer insulating layer 11 may be interposed between the electrode structure ST and the substrate 10 and may be formed of or include a silicon oxide layer. The buffer insulating layer 11 may be extended to conformally cover the peripheral gate stacks PGS on the peripheral circuit region PCR. Thus, the buffer insulating layer 11 may be extended to be interposed between the dummy sacrificial pattern DP and the peripheral gate stacks PGS.

In some embodiments, the electrode structure ST may include a lower electrode ELa, a lower insulating layer 25 on the lower electrode ELa, and upper electrodes ELb and upper insulating layers ILD, which are vertically and alternately stacked on the lower insulating layer 25.

The lower electrode ELa and the upper electrodes ELb may be formed of or include one or more of doped semiconductor (for example, doped silicon and so forth), metals (for example, tungsten, copper, aluminum, and so forth), conductive metal nitrides (for example, titanium nitride, tantalum nitride, and so forth), or transition metals (for example, titanium, tantalum, and so forth). The lower insulating layer 25 and the upper insulating layers ILD may be formed of or include, for example, high-density plasma (HDP) oxide, tetraethylorthosilicate (TEOS), plasma-enhanced tetraethylorthosilicate (PE-TEOS), $O_3$-tetra ethyl ortho silicate ($O_3$-TEOS), undoped silicate glass (USG), phosphosilicate glass (PSG), borosilicate glass (BSG), borophosphosilicate glass (BPSG), fluoride silicate glass (FSG), spin on glass (SOG), tonen silazene (TOSZ), or any combination thereof. The lower insulating layer 25 may be formed of an insulating material, which is the same as, or different from, that of the upper insulating layers ILD. As an example, the lower insulating layer 25 may be formed of HDP oxide, and the upper insulating layers ILD may be formed of TEOS.

The lower electrode ELa of the electrode structure ST may be a line-shaped pattern extending from the cell array region CAR to the connection region CNR or may be a plate-shaped pattern, which is provided to have an opening on a portion of the connection region CNR.

Top surfaces of the lower and upper electrodes ELa and ELb may be substantially parallel to the top surface of the substrate 10. A thickness Ta of the lower electrode ELa may be less than the first thickness T1 of the peripheral gate stacks PGS. The top surface of the lower electrode ELa may be positioned blow the top surfaces of the peripheral gate stacks PGS, and a bottom surface of the lowermost one of the upper electrodes ELb may be positioned above the top surfaces of the peripheral gate stacks PGS. Thus, the top surfaces of the peripheral gate stacks PGS may be positioned at a level between the lower electrode ELa and the lowermost one of the upper electrodes ELb.

In some embodiments, the thickness Ta of the lower electrode ELa may be substantially equal to a thickness Tb of the upper electrodes ELb. The lower insulating layer 25 may be thicker than each of the upper insulating layers ILD. Also, the lower insulating layer 25 may be thicker than each of the lower and upper electrodes ELa and ELb.

The lower insulating layer 25 may be extended from a region between the lower electrode ELa and the lowermost one of the upper electrodes ELb to the peripheral circuit region PCR. For example, the lower insulating layer 25 may include a portion that is provided on the peripheral circuit region PCR to cover the peripheral gate stacks PGS and the dummy sacrificial pattern DP.

The lower insulating layer 25 may include a flat portion 25F, which is provided on the cell array region CAR and the connection region CNR to cover the lower electrode ELa, and protruding portions 25P, which are provided on the peripheral circuit region PCR to cover the peripheral gate stacks PGS and to have an upward protruding shape.

Since the flat portion 25F of the lower insulating layer 25 is provided to cover the lower electrode ELa having an even top surface, the flat portion 25F may have a substantially even top surface 25a. The flat portion 25F of the lower insulating layer 25 may have a third thickness T3 that is substantially uniform and is larger than the first thickness T1 of the peripheral gate stacks PGS. In some embodiments, the third thickness T3 may be larger than the thickness of the upper insulating layers ILD. In some embodiments, a distance between the lower electrode ELa and the lowermost one of the upper electrodes ELb may vary depending on the third thickness T3 of the lower insulating layer 25. The even top surface 25a of the lower insulating layer 25 may be substantially parallel to the top surface of the substrate 10.

The top surface of the lower insulating layer 25 may be higher on the peripheral circuit region PCR than on the cell array region CAR. The lower insulating layer 25 may have an uneven top surface 25b on the peripheral circuit region PCR, owing to the protruding portions 25P. Thus, the lower insulating layer 25 on the peripheral circuit region PCR may have a variation in height of its top surface. In some embodiments, a top surface of the lower insulating layer 25 may have an uppermost level and a lowermost level. The uppermost level of the top surface of the lower insulating layer 25 may be referred to as an uppermost top level UL. The lowermost level of the top surface of the lower insulating layer 25 may be referred to as a lowermost top level LL.

On the peripheral circuit region PCR, the uppermost top level UL of the lower insulating layer 25 may be higher than that of the top surface of the lowermost one of the upper electrodes ELb. Furthermore, on the peripheral circuit region PCR, the uppermost top level UL of the lower insulating layer 25 may be higher than that of the top surface of the second one of the upper electrodes ELb. When viewed in a horizontal direction, the lowermost top level LL of the lower insulating layer 25 on the peripheral circuit region PCR may be located between the peripheral gate stacks PGS. A difference in distance, for example, height, between the lowermost and uppermost top levels LL and UL of the lower insulating layer 25 on the peripheral circuit region PCR may be larger than the thickness Tb of each of the upper electrodes ELb. The difference between the lowermost and uppermost top levels LL and UL of the lower insulating layer 25 on the peripheral circuit region PCR may be dependent on the first thickness T1 of the peripheral gate stacks PGS, a distance between the peripheral gate stacks PGS, and a condition in a process of depositing the lower insulating layer 25.

Each of the upper electrodes ELb may have a line- or 'H'-shaped pattern extending in the first direction D1. In some embodiments, lengths of the upper electrodes ELb of the electrode structure ST in the first direction D1 may decrease with increasing distance from the substrate 10, and a height of the electrode structure ST may decrease with increasing distance from the cell array region CAR.

Each of the lower and upper electrodes ELa and ELb may have a pad portion on the connection region CNR, and the pad portions of the lower and upper electrodes ELa and ELb may be located at different positions in horizontal and vertical directions.

The electrode structure ST may have a staircase structure on the connection region CNR. The staircase structure of the electrode structure ST may be variously changed. As an example, the electrode structure ST may have first and second staircase structures, which are defined by end portions of the lower and upper electrodes ELa and ELb on the connection region CNR, and here, the first and second staircase structures may be defined in the first and second directions D1 and D2, respectively.

An upper insulating gapfill layer 45 may be provided on the substrate 10 to cover the electrode structure ST on the cell array region CAR and the connection region CNR and the lower insulating layer 25 on the peripheral circuit region PCR. The upper insulating gapfill layer 45 may be provided to have a substantially even top surface and to have the largest thickness on the peripheral circuit region PCR. The upper insulating gapfill layer 45 may include a single insulating layer or a plurality of stacked insulating layers (for example, a silicon oxide layer and/or a low-k dielectric layer).

The upper insulating gapfill layer 45 may be formed of or include an insulating material different from that of the lower insulating layer 25. In the case where the lower insulating layer 25 is formed of HDP oxide, the upper insulating gapfill layer 45 may be an insulating layer whose etch rate is different from that of the HDP oxide. For example, the upper insulating gapfill layer 45 may be formed of or include TEOS, PE-TEOS, $O_3$-TEOS, USG, PSG, BSG, BPSG, FSG, SOG, TOSZ, or any combination thereof.

The upper insulating gapfill layer 45 on the peripheral circuit region PCR may be in direct contact with the uneven top surface 25b of the lower insulating layer 25. Since the dummy sacrificial pattern DP is covered with the lower insulating layer 25, the dummy sacrificial pattern DP may be spaced apart from the upper insulating gapfill layer 45.

A plurality of vertical structures VS may be provided to penetrate the electrode structure ST on the cell array region CAR and may be connected to the cell array region CAR of the substrate 10. Thus, the vertical structures VS may be provided to successively penetrate the upper insulating layers ILD, the upper electrodes ELb, the lower insulating layer 25, and the lower electrode ELa in a third direction D3. The vertical structures VS may be arranged in a row or in a zigzag manner, when viewed in a plan view. In an implementation, dummy vertical structures DVS may be formed on the connection region CNR and may have substantially the same structure as the vertical structures VS. The dummy vertical structures DVS may penetrate the end portions of the upper and lower electrodes ELb and Ela.

The vertical structures VS and the dummy vertical structures DVS may be formed of or include one or more of semiconductor materials (for example, silicon (Si), germanium (Ge), or mixtures thereof). In some embodiments, the vertical structures VS may be formed of a doped or intrinsic semiconductor material. The vertical structures VS containing the semiconductor material may be used as channel regions of the selection transistors SST and GST and the memory cell transistors MCT described with reference to FIG. 2.

Each of the vertical structures VS and the dummy vertical structures DVS may include a lower semiconductor pattern LSP and an upper semiconductor pattern USP. Referring to FIG. 5A, the lower semiconductor pattern LSP may be, for example, an epitaxial pattern which is epitaxially grown from the substrate 10. The lower semiconductor pattern LSP may be a pillar-shaped pattern filling a lower region of each of the vertical holes. The lower semiconductor pattern LSP may be formed to have, for example, a single- or polycrystalline structure. The lower semiconductor pattern LSP may be formed of, for example, carbon nano structures, organic semiconductor materials, and/or compound semiconductor materials. The lower semiconductor pattern LSP may have the same conductivity type as the substrate 10. A top surface of the lower semiconductor pattern LSP may be positioned above that of the lower electrode ELa. In some embodiments, the top surface of the lower semiconductor pattern LSP may be positioned between the top surface of the lower electrode ELa and the top surface of the lowermost one of the upper electrodes ELb.

The upper semiconductor pattern USP may be in contact with the lower semiconductor pattern LSP. For example, as shown in FIG. 5A, the upper semiconductor pattern USP may include a first semiconductor pattern SP1 and a second semiconductor pattern SP2. The first semiconductor pattern SP1 may be coupled to the lower semiconductor pattern LSP and may have a pipe or macaroni shape with closed bottom and open top. An inner space of the first semiconductor pattern SP1 may be filled with an insulating gapfill pattern VI. In addition, the first semiconductor pattern SP1 may be in contact with an inner surface of the second semiconductor pattern SP2 and the top surface of the lower semiconductor pattern LSP. Thus, the first semiconductor pattern SP1 may be provided to electrically connect the second semiconductor pattern SP2 to the lower semiconductor pattern LSP. The second semiconductor pattern SP2 may have a hollow pipe or macaroni shape with open top and bottom. In addition, the second semiconductor pattern SP2 may be spaced apart from, or not in contact with, the lower semiconductor pattern LSP.

The upper semiconductor pattern USP may be, for example, in an undoped state or may be doped to have the same conductivity type as the substrate 10. The upper semiconductor pattern USP may be, for example, doped with silicon (Si), germanium (Ge), or compounds thereof. In addition, the upper semiconductor pattern USP may have, for example, one of single-crystalline, amorphous, and polycrystalline structures. A conductive pad PAD may be formed on or in a top portion of each of the upper semiconductor patterns USP. The conductive pad PAD may be, for example, an impurity-doped region or formed of a conductive material.

As another example, as shown in FIG. 5B, each of the vertical structures VS may be configured to include the first semiconductor pattern SP1 and the second semiconductor pattern SP2, like the upper semiconductor pattern USP. The first semiconductor pattern SP1 may be in direct contact with the substrate 10, and an inner space of the first semiconductor pattern SP1 may be filled with the insulating gapfill pattern VI.

Referring to FIGS. 5A and 5B, a vertical insulating pattern VP may be provided between the electrode structure ST and the vertical structures VS. In the case where the vertical structures VS include the lower and upper semiconductor patterns LSP and USP, the vertical insulating pattern VP may be provided between the upper semiconductor pattern USP and the upper electrodes ELb. The vertical insulating pattern VP may be extended in the third direction D3 to surround a side surface of each of the vertical structures VS. Thus, the vertical insulating pattern VP may have a hollow pipe or macaroni shape with open top and bottom.

The vertical insulating pattern VP may include one or more layers. In some embodiments, the vertical insulating pattern VP may serve as a part of the data storing layer. For example, the vertical insulating pattern VP may be used as a part of a data storing layer of a NAND FLASH memory device and may include a tunnel insulating layer, a charge storing layer, and a blocking insulating layer. The charge storing layer may be, for example, a trap insulating layer, a floating gate electrode, or an insulating layer with conductive nanodots. The charge storing layer may include, for example, one or more of a silicon nitride layer, a silicon oxynitride layer, a silicon-rich nitride layer, a nanocrystalline silicon layer, or a laminated trap layer. The tunnel insulating layer may be formed of one or more materials having band gaps that are greater than that of the charge storing layer, and the blocking insulating layer may be formed of a high-k dielectric material (for example, aluminum oxide and hafnium oxide). In some embodiments, the vertical insulating layer may include a phase-change or variable-resistance layer.

A horizontal insulating pattern HP may be provided between side surfaces of the lower and upper electrodes ELa and ELb and the vertical insulating pattern VP. The horizontal insulating pattern HP may be provided to partially cover side surfaces of the lower and upper electrodes ELa and ELb and may be extended to cover top and bottom surfaces of the lower and upper electrodes ELa and ELb. A portion of the horizontal insulating pattern HP may be extended from a space between a gate insulating layer 15 and the lower electrode ELa to cover top and bottom surfaces of the lower electrode ELa, and here, the gate insulating layer 15 may be provided on a side surface of the lower semiconductor pattern LSP. The horizontal insulating pattern HP may be used as a part of the data storing layer of a NAND FLASH memory device and may include a charge storing layer and a blocking insulating layer. In some embodiments, the horizontal insulating pattern HP may be configured to have a blocking insulating layer.

Referring to FIGS. 3 and 4, common source regions CSR extending parallel to the electrode structures ST or in the first direction D1 may be provided in the substrate 10. The common source regions CSR may be doped with, for example, n-type impurities (for example, arsenic (As) or phosphorus (P)) to have a conductivity type different from that of the substrate 10.

As shown in FIG. 4, first and second interlayered insulating layers 51 and 53 may be sequentially stacked on the upper insulating gapfill layer 45 to cover top surfaces of the vertical structures VS.

Cell contact plugs CPLG may be provided to penetrate the first and second interlayered insulating layers 51 and 53 and the upper insulating gapfill layer 45 and may be coupled to pad portions of the upper electrodes ELb, respectively. One of the cell contact plugs CPLG may be provided to penetrate the first and second interlayered insulating layers 51 and 53, the upper insulating gapfill layer 45, and the lower insulating layer 25, and may be coupled to an end portion of the lower electrode ELa. Vertical lengths of the cell contact plugs CPLG may decrease with decreasing distance from the cell array region CAR. Top surfaces of the cell contact plugs CPLG may be substantially coplanar with each other.

Peripheral contact plugs PPLG may be provided to penetrate the first and second interlayered insulating layers 51 and 53, the upper insulating gapfill layer 45, the lower insulating layer 25, and the dummy sacrificial pattern DP and may be coupled to the peripheral circuit structure. For example, the peripheral contact plugs PPLG may be coupled to the source and drain impurity regions 13.

Sub-bit lines SBL may be provided on the second interlayered insulating layer 53 of the cell array region CAR and may be electrically connected to the vertical structures VS through the contact plugs PLG. Connection lines CL may be provided on the second interlayered insulating layer 53 of the connection region CNR and may be coupled to the cell contact plugs CPLG. Peripheral lines PCL may be provided on the second interlayered insulating layer 53 of the peripheral circuit region PCR and may be coupled to the peripheral contact plugs PPLG.

A third interlayered insulating layer 60 may be provided on the second interlayered insulating layer 53 to cover the sub-bit lines SBL, the connection lines CL, and the peripheral lines PCL. Bit lines BL may be provided on the third interlayered insulating layer 60 to cross the electrode structure ST and extend in the second direction D2. The bit lines BL may be coupled to the sub-bit lines SBL through bit line contact plugs BPLG.

Figure 6:
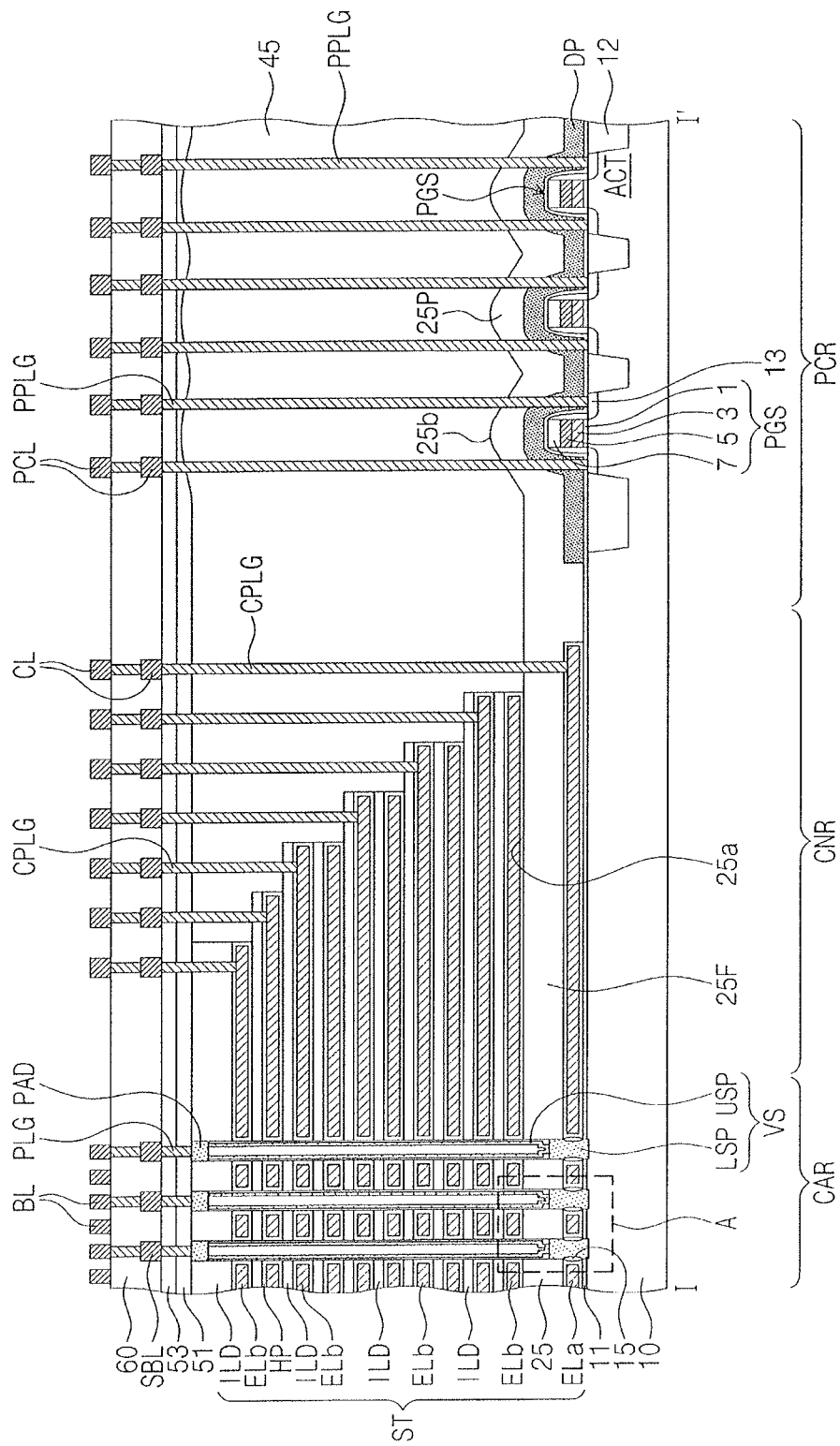
FIGS. 6, 7, and 8 illustrate sectional views illustrating three-dimensional semiconductor memory devices according to an example embodiment, taken along line I-I' of FIG. 3.
Figure 7:
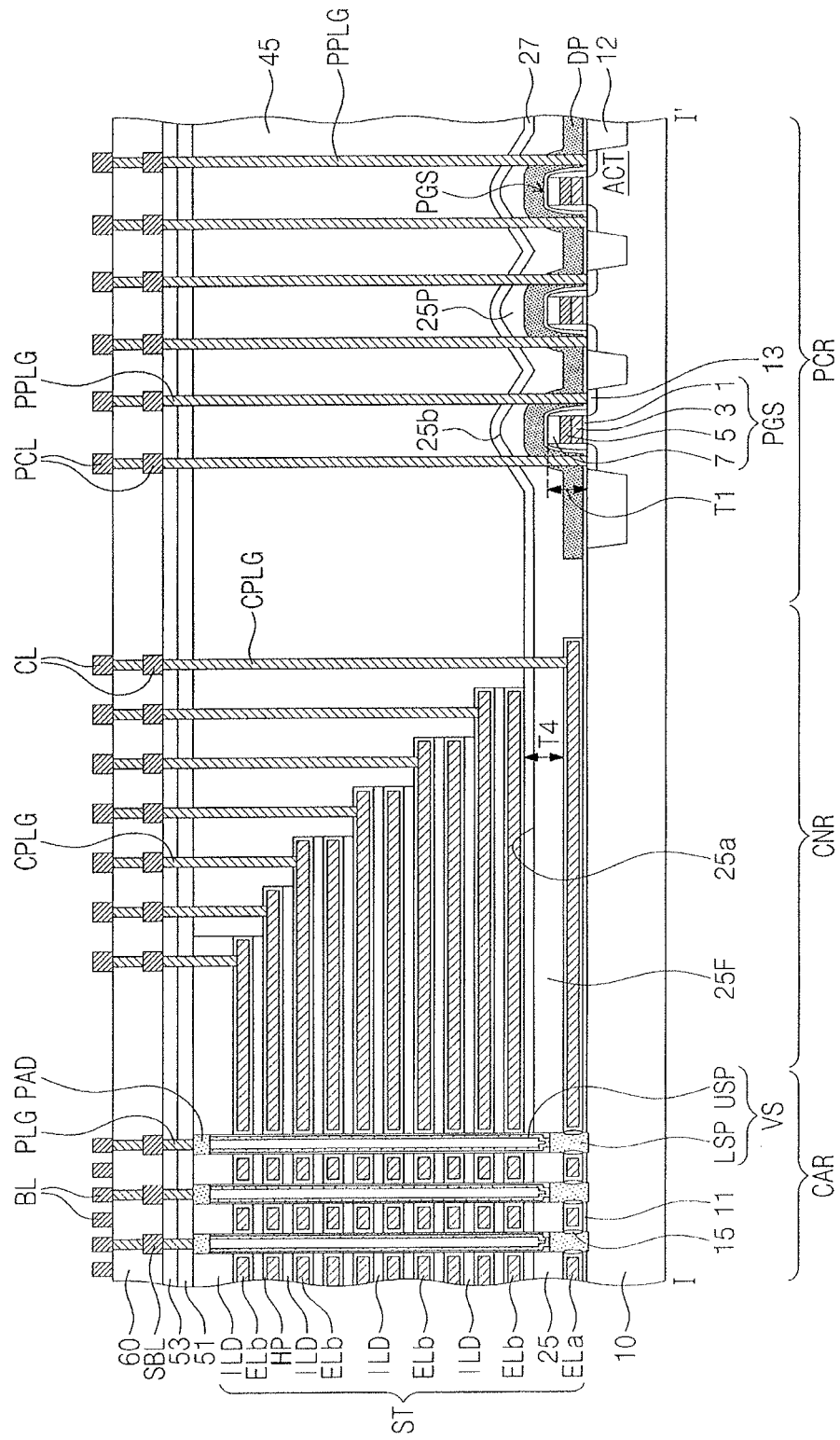
Figure 8:
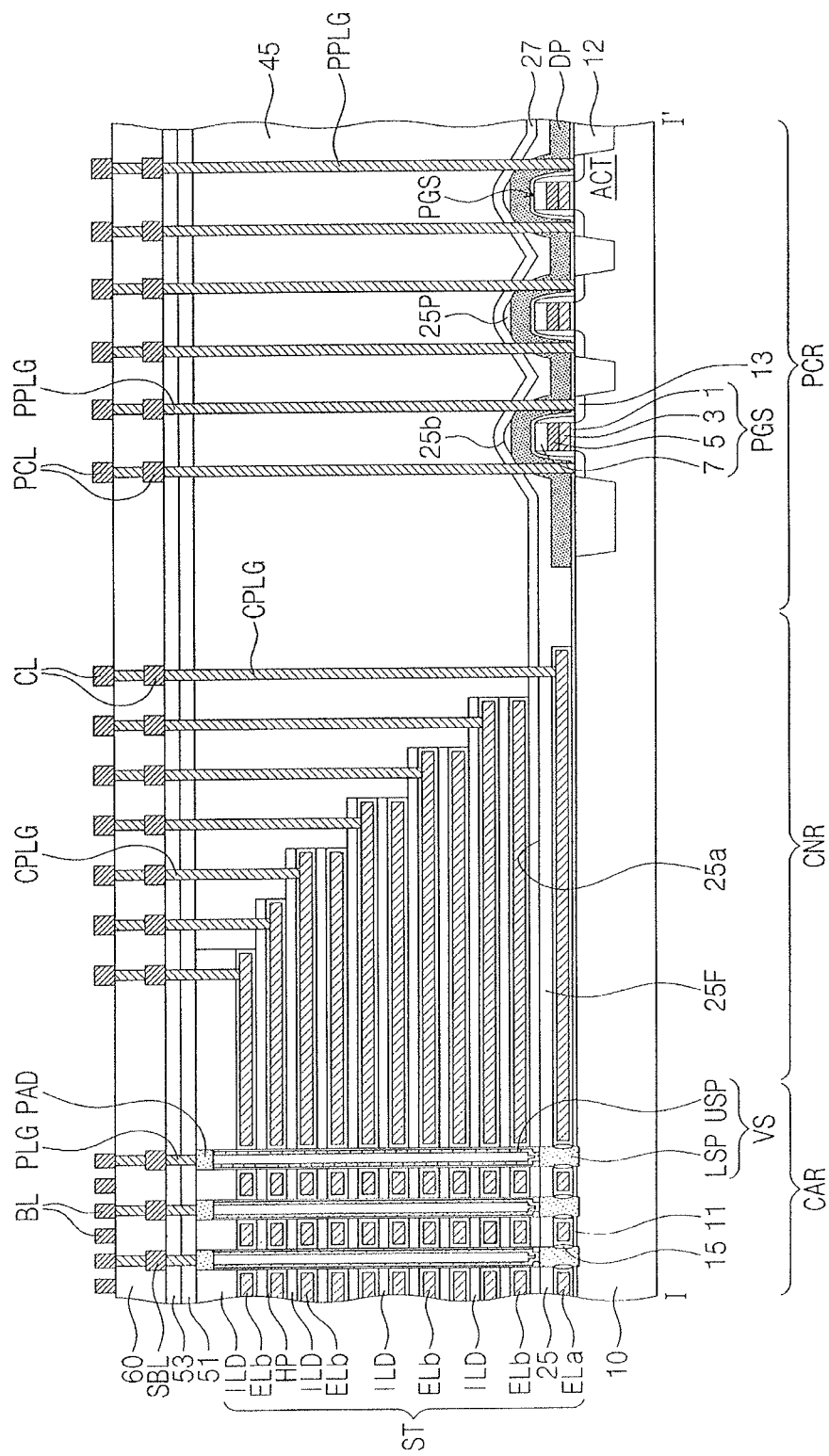

FIGS. 6, 7, and 8 are sectional views illustrating three-dimensional semiconductor memory devices according to an example embodiment, taken along line I-I' of FIG. 3. For concise description, an element previously described with reference to FIGS. 3, 4, 5A, and 5B may be identified by a similar or identical reference number without repeating an overlapping description thereof.

Referring to FIG. 6, on the peripheral circuit region PCR, the lower insulating layer 25 and the upper insulating gapfill layer 45 may have curved top surfaces. Thus, the upper insulating gapfill layer 45 on the peripheral circuit region PCR may have an uneven top surface. A difference in distance, for example, height, between the uppermost and lowermost levels of the top surface of the upper insulating gapfill layer 45 may be smaller than that in the lower insulating layer 25.

Referring to FIGS. 7 and 8, the first lower insulating layer 25 and a second lower insulating layer 27 may be provided between the lower electrode ELa and the lowermost one of the upper electrodes ELb. Here, the first lower insulating layer 25 may include the flat portion 25F on the cell array region CAR and the protruding portions 25P on the peripheral circuit region PCR, as described above. The second lower insulating layer 27 may be formed to conformally cover the top surface of the first lower insulating layer 25 and to be thinner than the first lower insulating layer 25. The second lower insulating layer 27 on the cell array region CAR may have a substantially even top surface, like the first lower insulating layer 25. A thickness of the second lower insulating layer 27 may be thinner on the peripheral circuit region PCR than on the cell array region CAR. The second lower insulating layer 27 may be formed of an insulating material that is the same as, or different from, that of the first lower insulating layer 25.

In the embodiment shown in FIG. 7, a sum of thicknesses of the first and second lower insulating layers 25 and 27 may be larger than the thickness T1 of the peripheral gate stacks PGS. In the embodiment shown in FIG. 7, the second lower insulating layer 27 may be spaced apart from the dummy sacrificial pattern DP by the first lower insulating layer 25.

In the embodiment shown in FIG. 8, an even top surface of the first lower insulating layer 25 may be positioned at a lower level than the uppermost surface of the dummy sacrificial pattern DP on the peripheral circuit region PCR. In addition, the second lower insulating layer 27 may be extended to directly cover the dummy sacrificial pattern DP on the peripheral circuit region PCR.

Figure 9:
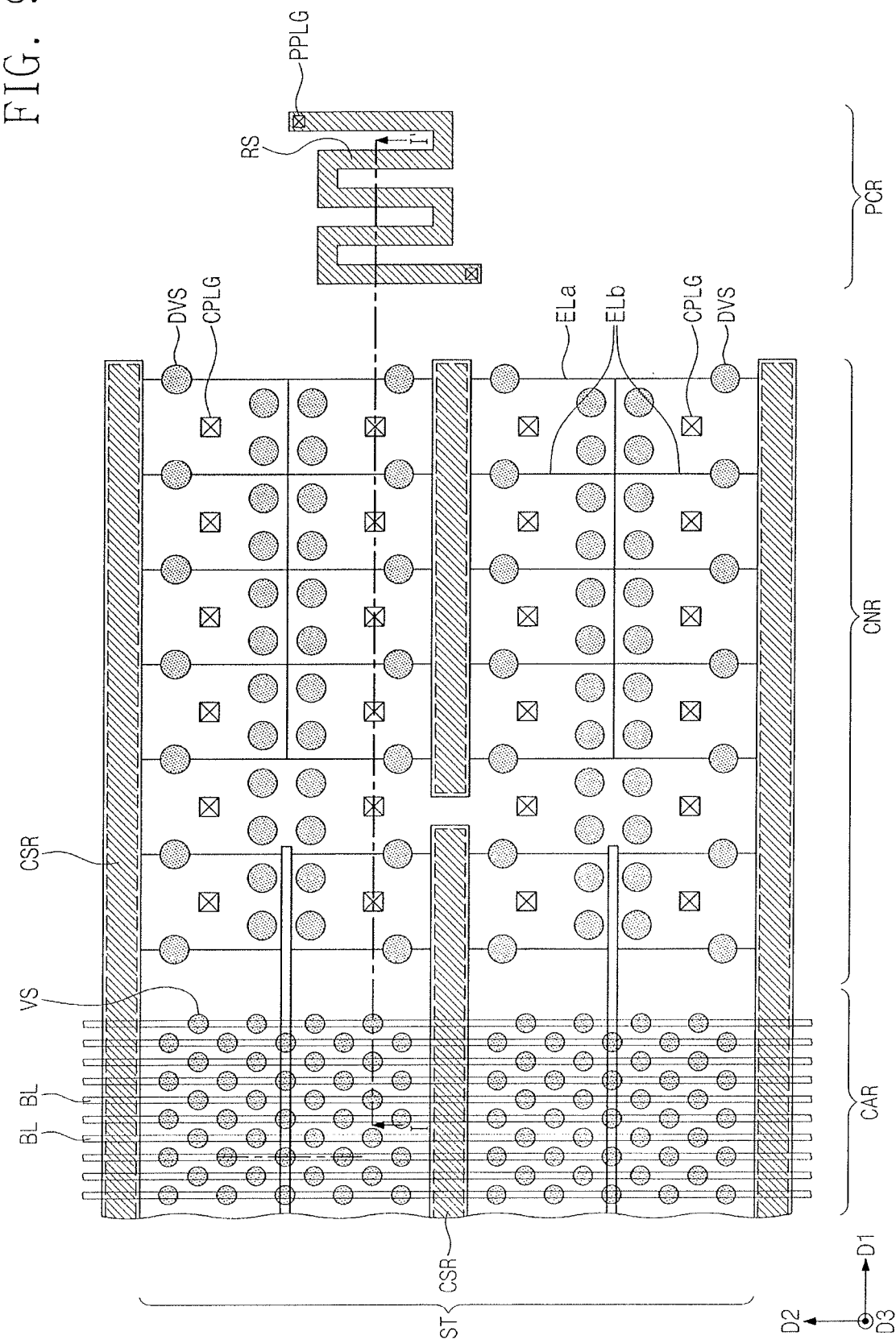
FIG. 9 illustrates a plan view illustrating a three-dimensional semiconductor memory device according to an example embodiment.
Figure 10:
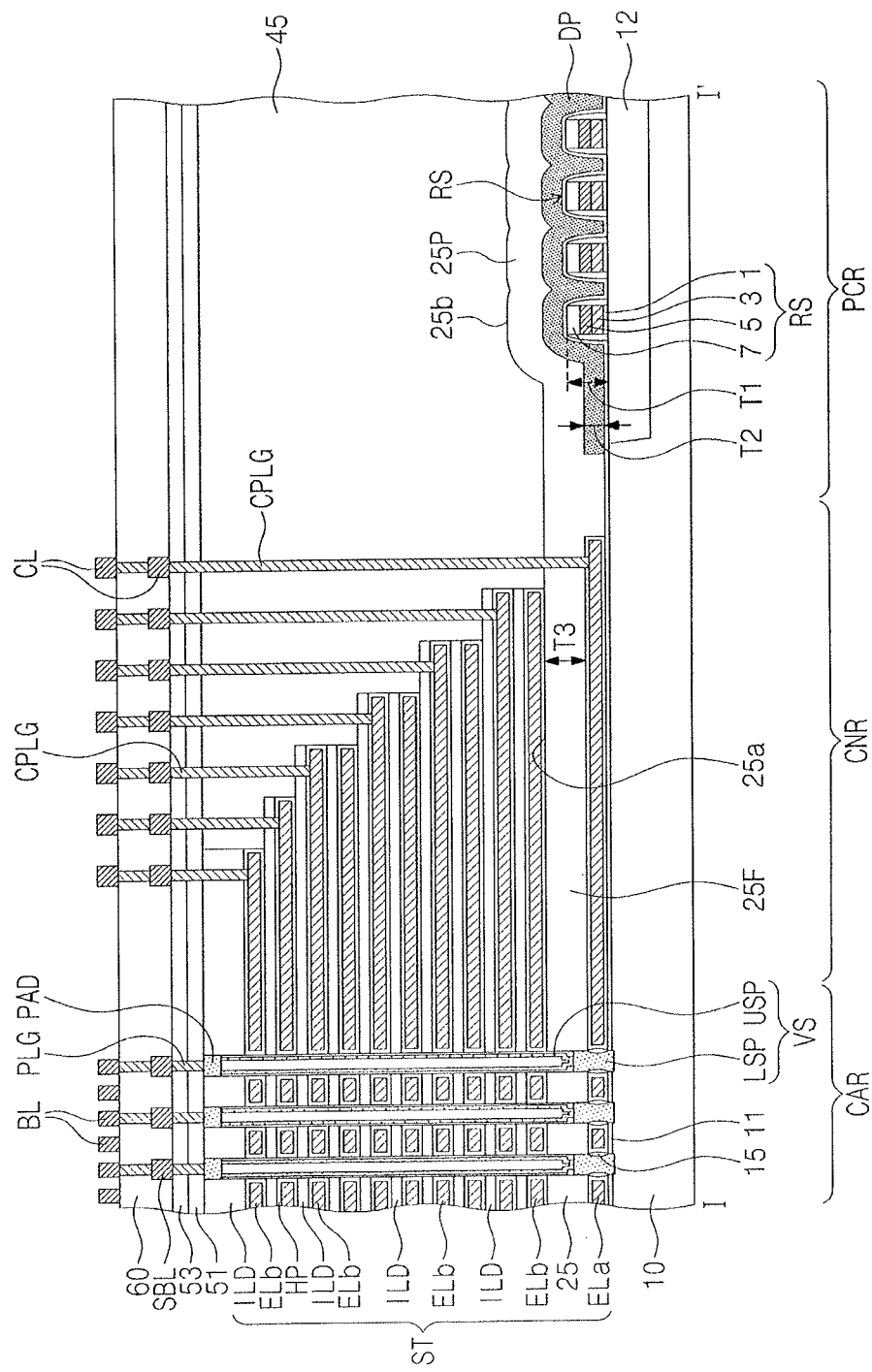
FIG. 10 illustrates a sectional view taken along line I-I' of FIG. 9.
Figure 11:
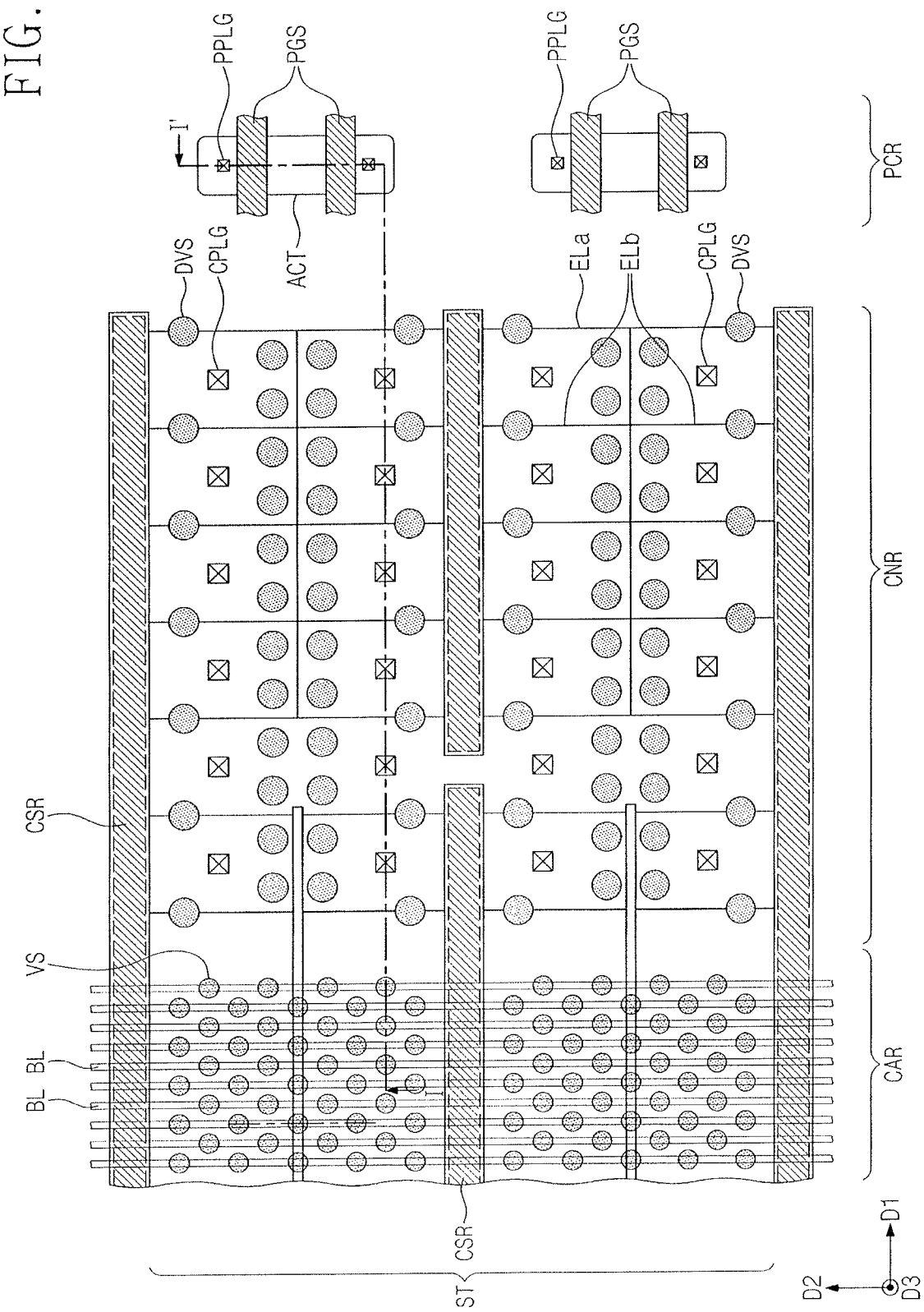
FIG. 11 illustrates a plan view illustrating a three-dimensional semiconductor memory device according to an example embodiment.
Figure 12:
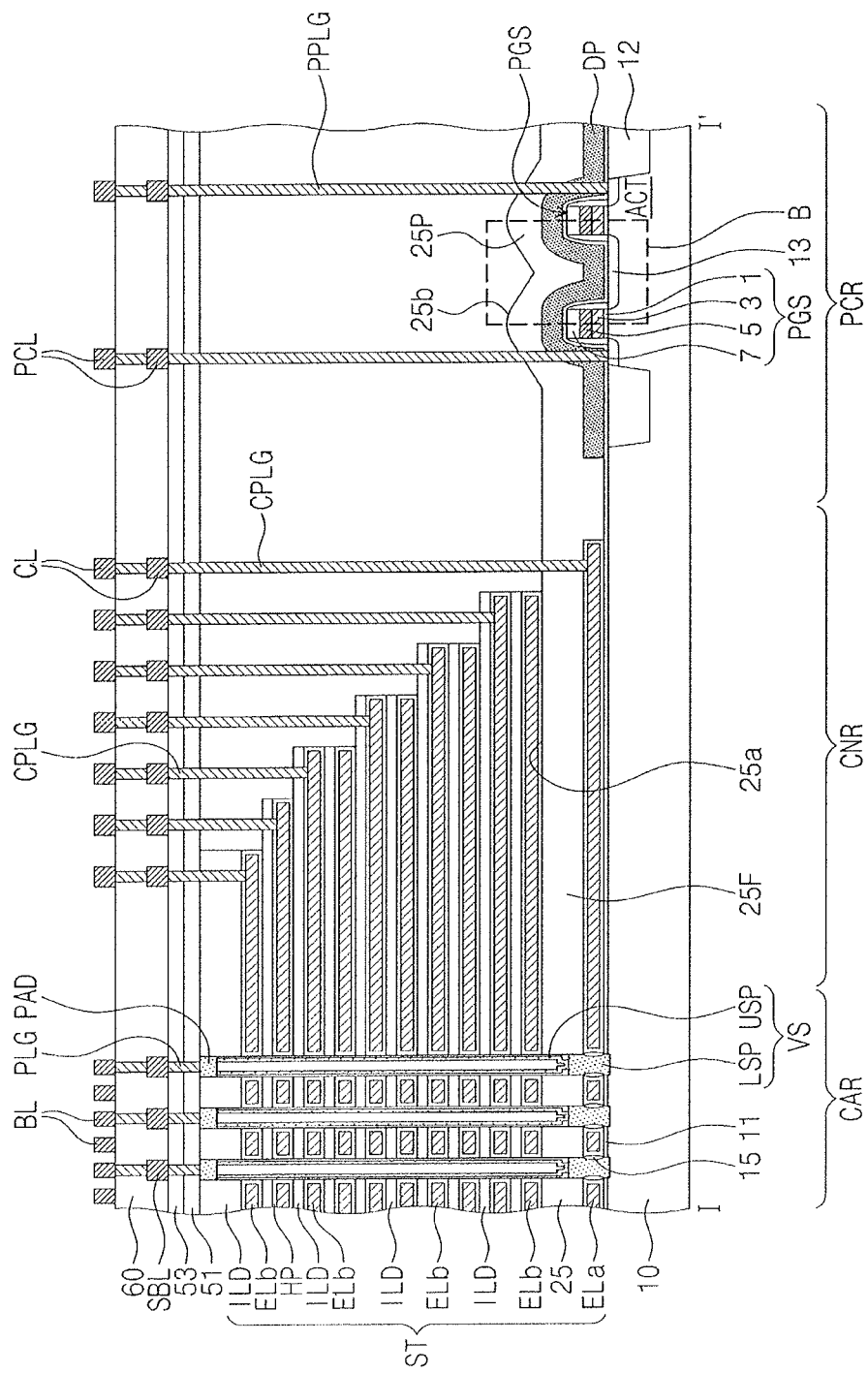
FIG. 12 illustrates a sectional view taken along line I-I' of FIG. 11.
Figure 13:
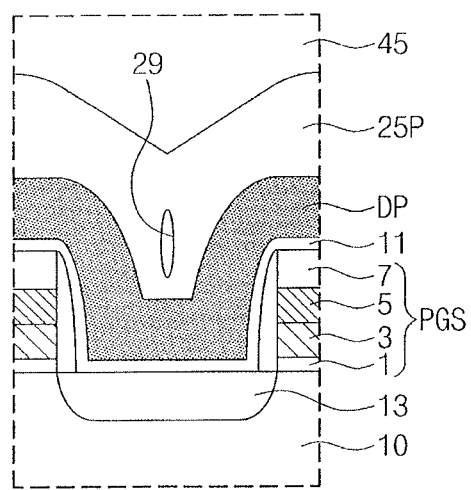
FIG. 13 illustrates an enlarged sectional view illustrating a portion 'B' of FIG. 12.

FIG. 9 is a plan view illustrating a three-dimensional semiconductor memory device according to an example embodiment. FIG. 10 is a sectional view taken along line I-I' of FIG. 9. FIG. 11 is a plan view illustrating a three-dimensional semiconductor memory device according to an example embodiment. FIG. 12 is a sectional view taken along line I-I' of FIG. 11. FIG. 13 is an enlarged sectional view illustrating a portion 'B' of FIG. 12. For concise description, an element previously described with reference to FIGS. 3, 4, 5A, and 5B may be identified by a similar or identical reference number without repeating an overlapping description thereof.

Referring to FIGS. 9 and 10, resistor stacks RS may be provided on the peripheral circuit region PCR of the substrate 10. The resistor stacks RS may have a stacking structure similar to that of the peripheral gate stacks PGS described above. The resistor stacks RS may be connected to each other, thereby constituting a single resistor having a zigzag shape.

The resistor stacks RS may have the first thickness T1, when measured from the top surface of the substrate 10, and lengths or widths of the resistor stacks RS may be changed according to their resistance values. A distance between the resistor stacks RS in the embodiments shown in FIGS. 9 and 10 may be smaller than that between the peripheral gate stacks PGS in the embodiments described with reference to FIGS. 3 and 4. The distance between the resistor stacks RS may be smaller than about 2 times the thickness T2 of the dummy sacrificial pattern DP. In this case, the dummy sacrificial pattern DP may be provided to fill a gap region between the resistor stacks RS.

The lower insulating layer 25 may be extended from the lower electrode ELa on the cell array region CAR to cover the resistor stacks RS on the peripheral circuit region PCR. As described above, a level of a top surface of the lower insulating layer 25 may be higher on the peripheral circuit region PCR than on the cell array region CAR. In the case where the dummy sacrificial pattern DP is formed to fill a gap region between the resistor stacks RS, the top surface of the lower insulating layer 25 on the peripheral circuit region PCR may have a reduced height difference (i.e., between the uppermost and lowermost top levels).

In the embodiments shown in FIGS. 11 and 12, a pair of MOS transistors sharing a source region may be provided on the peripheral circuit region PCR of the substrate 10. Referring to FIGS. 11 and 12, a distance between the peripheral gate stacks PGS on the peripheral circuit region PCR may be smaller than that in the previous embodiments described with reference to FIGS. 3 and 4. The dummy sacrificial pattern DP may be provided to conformally cover the peripheral gate stacks PGS and the top surface of the substrate 10.

The lower insulating layer 25 may be provided to fill a gap between the peripheral gate stacks PGS on the dummy sacrificial pattern DP. In the case where the gap region between the peripheral gate stacks PGS is narrow, the lower insulating layer 25 may have an air gap 29 or a void between the peripheral gate stacks PGS, as shown in FIG. 13.

Figure 14:
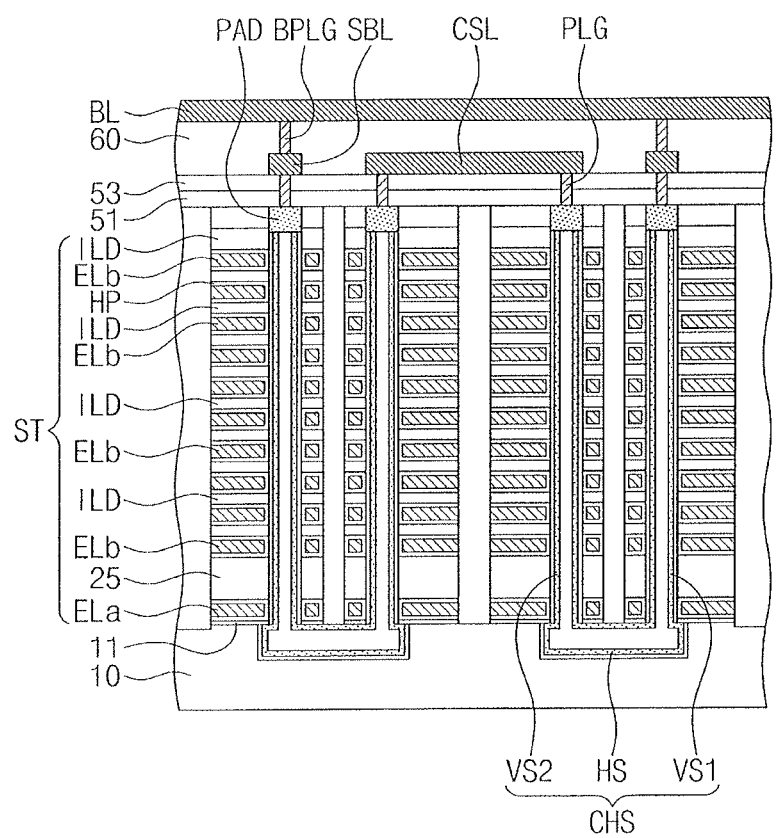
FIG. 14 illustrates a sectional view illustrating a cell array region of a three-dimensional semiconductor memory device according to an example embodiment.

FIG. 14 is a sectional view illustrating a cell array region of a three-dimensional semiconductor memory device according to an example embodiment.

Referring to FIG. 14, the electrode structures ST may be provided on the substrate 10 to extend in a specific direction and to be spaced apart from each other. As described above, each of the electrode structures ST may include the lower electrode ELa, the lower insulating layer 25 on the lower electrode ELa, and the upper electrodes ELb and the upper insulating layers ILD, which are vertically and alternately stacked on the lower insulating layer 25.

Channel structures CHS may be provided to penetrate the electrode structure ST on the cell array region CAR. In some embodiments, each of the channel structures CHS may include first and second vertical channels VS1 and VS2, which are provided to penetrate the electrode structure ST, and a horizontal channel HS, which is provided below the electrode structure ST to connect the first and second vertical channels VS1 and VS2 to each other. The first and second vertical channels VS1 and VS2 may be provided in vertical holes that are formed to penetrate the electrode structure ST. The horizontal channel HS may be provided in a recess region, which is formed in an upper portion of the substrate 10. The horizontal channel HS may be provided between the substrate 10 and the electrode structure ST, and may be used to connect the first and second vertical channels VS1 and VS2 to each other.

In some embodiments, the horizontal channel HS may be a hollow structure (for example, in a pipe or a macaroni shape), which is continuously connected to the first and second vertical channels VS1 and VS2. Thus, the first and second vertical channels VS1 and VS2 and the horizontal channel HS may be connected to form a single pipe-shaped structure. Thus, the first and second vertical channels VS1 and VS2 and the horizontal channel HS may be a single continuous semiconductor pattern that is substantially absent of any interface therein. Furthermore, as described above, a data storing layer may be interposed between the channel structures CHS and the lower and upper electrodes ELa and ELb.

In some embodiments, the first vertical channel VS1 of each channel structure CHS may be connected to the bit line BL, and the second vertical channel VS2 may be connected to a common source line CSL. The channel structures CHS may be electrically disconnected from each other, and an electric potential of each of the channel structures CHS may be controlled by the electrode structure ST, because the channel structures CHS contain a semiconductor material. Each of the channel structures CHS may be used as a current path between the bit line BL and the common source line CSL.

FIGS. 15 to 28 are sectional views illustrating a method of fabricating a three-dimensional semiconductor memory device according to an example embodiment, taken along line I-I' of FIG. 3.

Referring to FIGS. 3 and 15, the peripheral gate stacks PGS may be formed on the peripheral circuit region PCR of the substrate 10.

For example, the device isolation layer 12 may be formed on the peripheral circuit region PCR to define the active regions ACT in the substrate 10. The formation of the device isolation layer 12 may include forming a trench in the peripheral circuit region PCR of the substrate 10 and filling the trench with an insulating material.

The peripheral gate stacks PGS may be formed on the peripheral circuit region PCR of the substrate 10 to cross the active regions ACT. The formation of the peripheral gate stacks PGS may include sequentially stacking the peripheral gate insulating layer 1, the doped poly-silicon layer 3, the gate metal layer 5, and the hard mask layer 7 on the substrate 10 and then patterning the layers. Spacers may be formed to cover side surfaces of each of the peripheral gate stacks PGS, and the source and drain impurity regions 13 may be formed by doping portions of the active regions ACT, which are located at both sides of each of the peripheral gate stacks PGS, with first impurities (for example, boron (B) or phosphorus (P)).

The peripheral gate stacks PGS may have a first thickness T1 as measured from the top surface of the substrate 10 (i.e., a vertical distance between the top surface of the substrate 10 and the top surfaces of the peripheral gate stacks PGS). Distance between the peripheral gate stacks PGS may vary from region to region.

After the formation of the peripheral circuit structure, the buffer insulating layer 11 and a lower sacrificial layer LSL may be sequentially formed to cover the substrate 10 provided with the peripheral gate stacks PGS.

The lower sacrificial layer LSL may be formed to conformally cover the top surface of the substrate 10 and the peripheral gate stacks PGS. The lower sacrificial layer LSL may have the second thickness T2, which is substantially uniform, and may extend from the cell array region CAR to the peripheral circuit region PCR. In some embodiments, the second thickness T2 of the lower sacrificial layer LSL may be smaller than the first thickness T1 of the peripheral gate stack PGS. In the case where, as described with reference to FIGS. 9 and 10, the peripheral gate stacks PGS are provided to be adjacent to each other, the lower sacrificial layer LSL may be formed on the peripheral circuit region PCR to fill gap regions between the peripheral gate stacks PGS.

The lower sacrificial layer LSL may be formed of or include a material having an etch selectivity with respect to the buffer insulating layer 11. For example, the lower sacrificial layer LSL may be formed of one or more of silicon nitride, silicon oxynitride, silicon carbide, or silicon germanium.

The buffer insulating layer 11 may be formed not only between the lower sacrificial layer LSL and the substrate 10 but also between the lower sacrificial layer LSL and the peripheral gate stacks PGS. In some embodiments, the buffer insulating layer 11 may be a silicon oxide layer, which may be formed by, for example, a thermal oxidation process or a deposition process.

Referring to FIGS. 3 and 16, the lower sacrificial layer LSL may be patterned to form a lower sacrificial pattern LP and the dummy sacrificial pattern DP, which are separated from each other.

The dummy sacrificial pattern DP may be formed on the peripheral circuit region PCR to cover the top surface of the substrate 10 and the peripheral gate stacks PGS, and the lower sacrificial pattern LP may be formed on the cell array region CAR and the connection region CNR to cover the top surface of the substrate 10. The lower sacrificial pattern LP may be formed on the top surface of the substrate 10. Thus, it may have a substantially even top surface.

The lower sacrificial pattern LP may be, for example, a plate-shaped pattern covering all of the cell array region CAR and the connection region CNR of the substrate 10, or a line-shaped pattern extending from the cell array region CAR to the connection region CNR. In some embodiments, the lower sacrificial pattern LP may have an opening on the connection region CNR.

Figure 17:
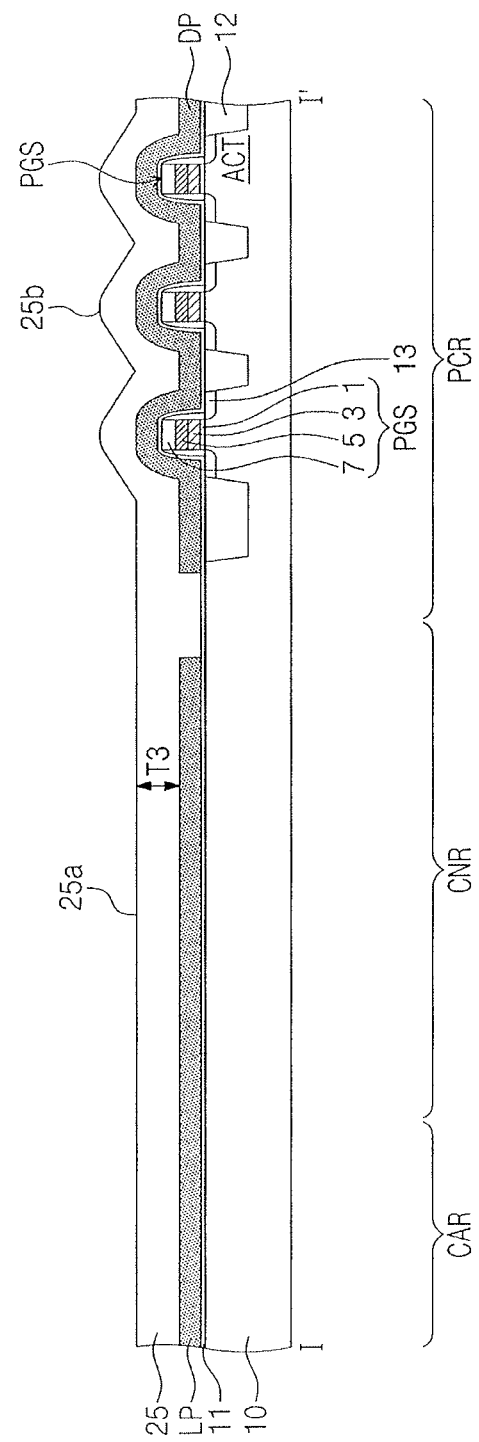

Referring to FIGS. 3 and 17, the lower insulating layer 25 may be formed to cover the substrate 10. The lower insulating layer 25 may be deposited on the lower sacrificial pattern LP and the dummy sacrificial pattern DP.

The cell array region CAR and the connection region CNR may have an area larger than that of the peripheral circuit region PCR. Also, the lower sacrificial pattern LP may have a uniform thickness on the cell array region CAR and the connection region CNR. Thus, the lower insulating layer 25 covering the lower sacrificial pattern LP may be deposited to have a substantially uniform thickness on the cell array region CAR, and the lower insulating layer 25 may have a substantially even top surface 25a on the cell array region CAR and the connection region CNR.

In some embodiments, the top surface 25a of the lower insulating layer 25 on the cell array region CAR may be positioned above the uppermost surface of the dummy sacrificial pattern DP on the peripheral circuit region PCR. In some embodiments, the top surface 25a of the lower insulating layer 25 on the cell array region CAR may be positioned at a lower level than the uppermost surface of the dummy sacrificial pattern DP on the peripheral circuit region PCR.

On the cell array region CAR and the connection region CNR, the lower insulating layer 25 may have the third thickness T3, which may be larger than the first thickness T1 of the peripheral gate stack PGS. The third thickness T3 of the lower insulating layer 25 may be larger than a distance from the top surface of the substrate 10 to the uppermost surface of the dummy sacrificial pattern DP (i.e., the sum of the first and second thicknesses T1 and T2).

Owing to a difference between the first thickness T1 of the peripheral gate stack PGS and the second thickness T2 of the lower sacrificial layer LSL, a level of the top surface of the lower insulating layer 25 on the cell array region CAR may be different from that on the peripheral circuit region PCR. For example, the top surface of the lower insulating layer 25 may be higher on the peripheral circuit region PCR than on the cell array region CAR. The lower insulating layer 25 on the peripheral circuit region PCR may be formed on the dummy sacrificial pattern DP covering the peripheral gate stacks PGS. Thus, it may have an uneven top surface 25b.

In some embodiments, the lower insulating layer 25 may be a silicon oxide layer deposited on the substrate 10 using, for example, a high density plasma chemical vapor deposition (HDP-CVD) process. For example, the lower insulating layer 25 may be a HDP-CVD oxide layer. A chemical vapor deposition method, in conjunction with a sputtering-based etching method, may be used for the HDP-CVD process, and for example, if a silicon oxide layer is deposited using the HDP-CVD process, not only a deposition gas for depositing a silicon oxide layer but also an etching gas for etching an insulating layer may be supplied during the HDP-CVD process. The deposition and etching gases, which are supplied to form the silicon oxide layer, may be ionized by plasma, and the ions of the deposition and etching gases may be accelerated toward the substrate 10. The accelerated ions of the deposition gas may be used to form the silicon oxide layer, and the accelerated ions of the etching gas may be used to etch the deposited silicon oxide layer. Thus, both of the deposition and etching processes may be simultaneously performed when the lower insulating layer 25 is formed. When the deposition rate is higher the etch rate, the lower insulating layer 25 may be deposited on the dummy sacrificial pattern DP to fill a gap region between the peripheral gate stacks PGS. When the lower insulating layer 25 is formed by the HDP-CVD method, a deposition thickness of the lower insulating layer 25 may be deposited to be smaller on side surfaces of the peripheral gate stacks PGS than on the top surface of the substrate 10 between the peripheral gate stacks PGS and on the top surfaces of the peripheral gate stacks PGS. Thus, if the lower insulating layer 25 is formed by the HDP-CVD method, it may be formed to have an upwardly convex shape on the peripheral gate stacks PGS, as shown in FIG. 17.

The lower insulating layer 25 may have upwardly convex portions on the peripheral circuit region PCR (in particular, on the peripheral gate stacks PGS). The uppermost top surface of the lower insulating layer 25 may be positioned on the peripheral gate stacks PGS, and the lowermost top surface of the lower insulating layer 25 may be positioned between the peripheral gate stacks PGS. As an example, a difference between the uppermost and lowermost top levels of the lower insulating layer 25 may be smaller than a deposition thickness (i.e., the third thickness T3) of the lower insulating layer 25 on the cell array region CAR.

Figure 18:
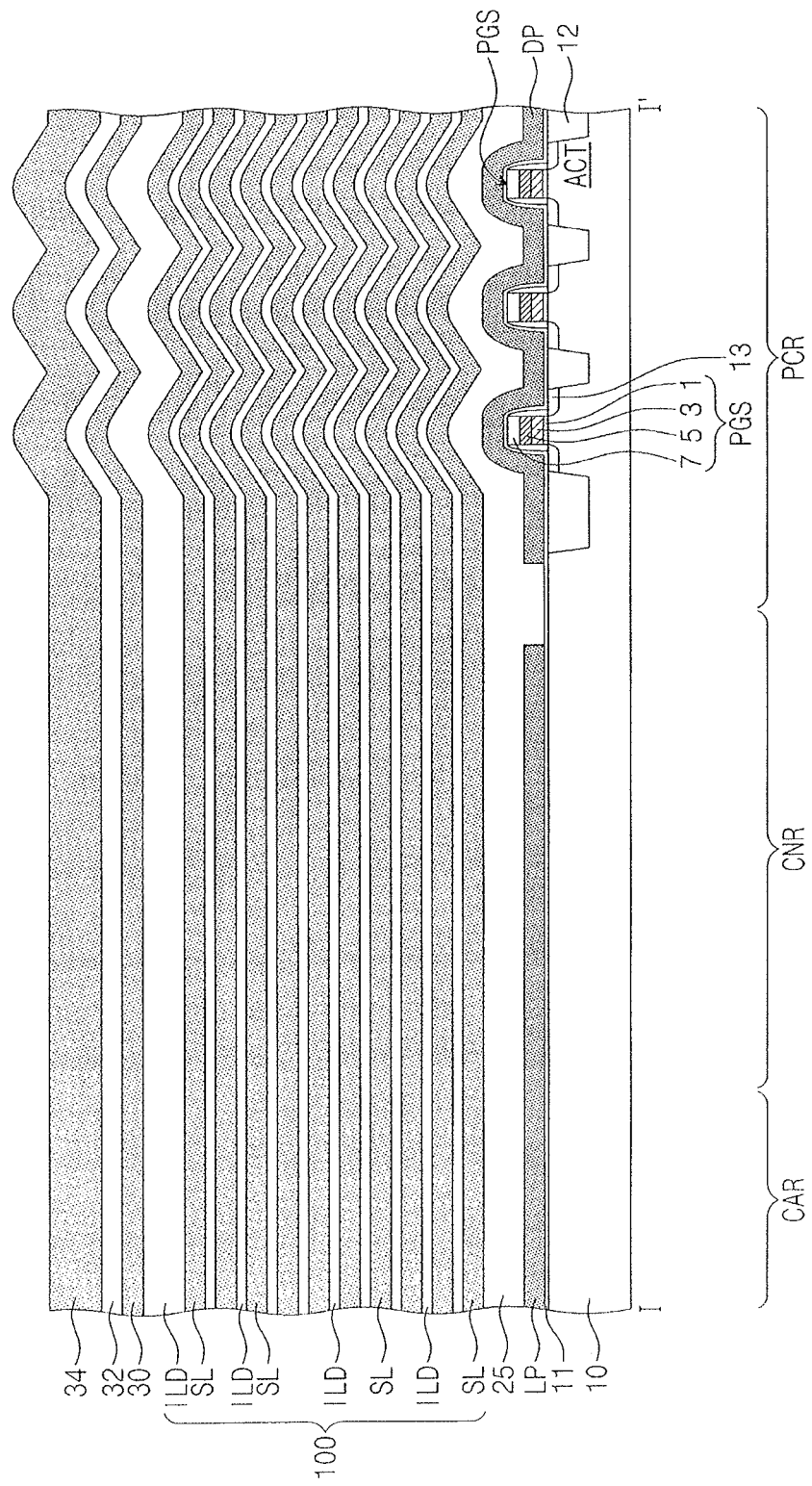

Referring to FIGS. 3 and 18, a layered structure 100 may be formed on the lower insulating layer 25 of the cell array region CAR and the connection region CNR. The layered structure 100 may include upper sacrificial layers SL and upper insulating layers ILD, which are vertically and alternately stacked on the lower insulating layer 25.

The upper sacrificial layers SL of the layered structure 100 may be formed of a material which can be etched with a high etch selectivity with respect to the upper insulating layers ILD. As an example, the upper sacrificial layers SL and the upper insulating layers ILD may be formed of insulating materials having an etch selectivity with respect to each other. Thus, the upper sacrificial layers SL may be formed of an insulating material that is different from the upper insulating layers ILD. In some embodiments, the upper sacrificial layers SL may be formed of the same material as the lower sacrificial pattern LP and may have a thickness that is substantially equal to that of the lower sacrificial pattern LP. The upper insulating layers ILD may be thinner than the lower insulating layer 25 and may be formed of an insulating material different from the lower insulating layer 25. The uppermost one of the upper insulating layers may be thicker than the others of the upper insulating layers. As an example, the upper sacrificial layers SL may be formed of silicon nitride, and the upper insulating layers ILD may be formed of TEOS.

In some embodiments, the layered structure 100 may be formed in such a way that the lowermost one of the upper sacrificial layers SL is in contact with the top surface of the lower insulating layer 25. In some embodiments, the upper insulating layer ILD may be in contact with the top surface of the lower insulating layer 25.

Each of the upper sacrificial layers SL and the upper insulating layers ILD may be deposited to have a uniform thickness on the top surface of the lower insulating layer 25. The lower insulating layer 25 may have a substantially even top surface on the cell array region CAR and an uneven top surface on the peripheral circuit region PCR. Thus, the layered structure 100 may also have a substantially even top surface on the cell array region CAR and an uneven top surface on the peripheral circuit region PCR.

A first etch stop layer 30, a dummy insulating layer 32, and a second etch stop layer 34 may be sequentially stacked on the uppermost one of the upper insulating layers ILD of the layered structure 100. Each of the first and second etch stop layers 30 and 34 may be formed of a material that is selected to have an etch selectivity with respect to the upper insulating layers ILD and the dummy insulating layer 32. For example, each of the first and second etch stop layers 30 and 34 may include a silicon nitride layer or a silicon oxynitride layer. The second etch stop layer 34 may be thicker than the first etch stop layer 30. As an example, a thickness of the second etch stop layer 34 may be larger than a difference between the uppermost and lowermost top levels of the lower insulating layer 25.

Examples, in which two etch stop layers (for example, 30 and 34) are stacked on a mold structure 110, have been described with reference to the above embodiments, but in certain embodiments, three or four etch stop layers, between which dummy insulating layers are interposed, may be stacked on the mold structure 110. In some embodiments, a single etch stop layer may be formed on the mold structure 110.

Figure 19:
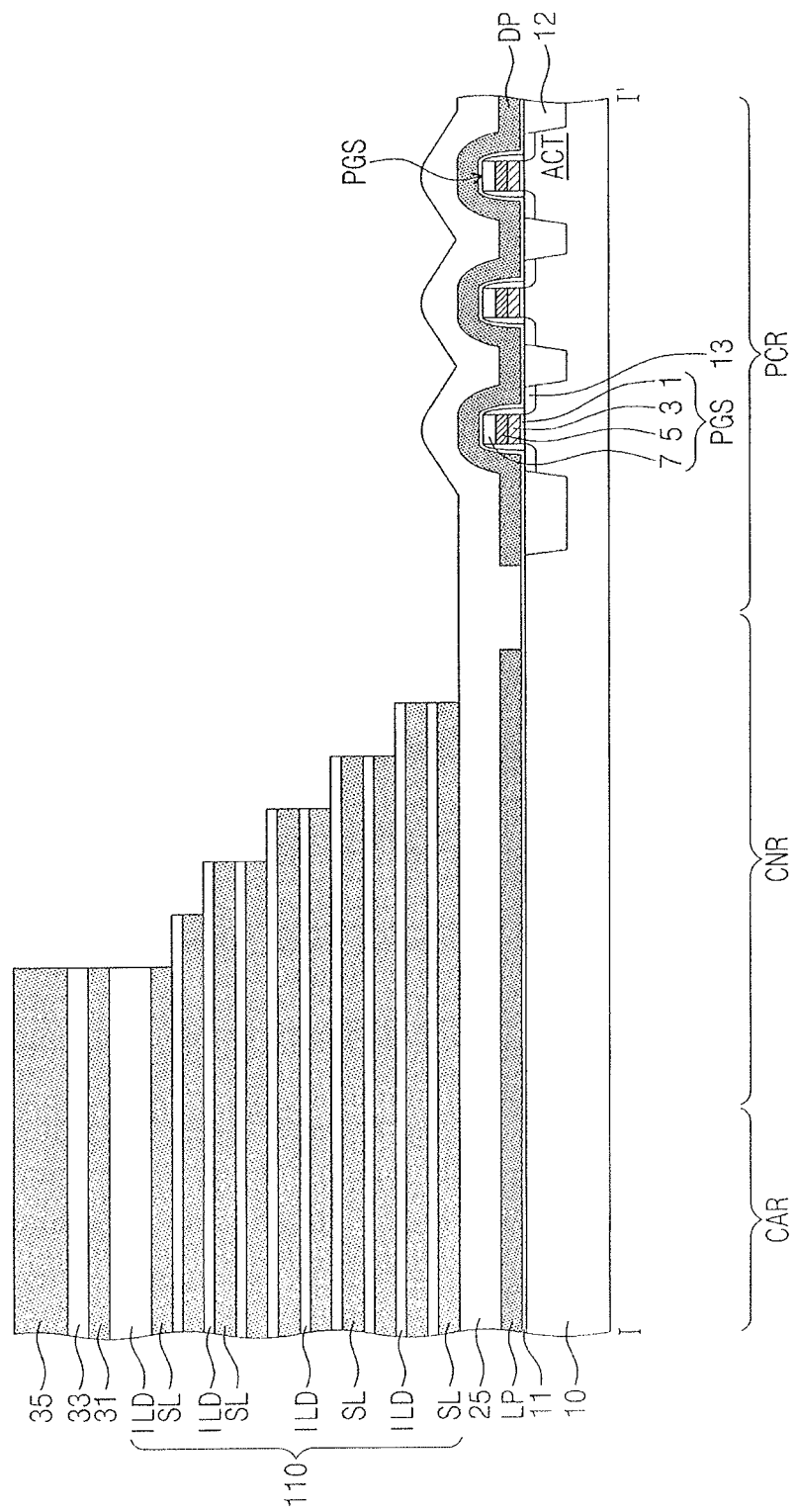

Referring to FIGS. 3 and 19, a trimming process may be performed on the layered structure 100 to form a mold structure 110.

The trimming process may include operations of forming a mask pattern covering the layered structure 100 on the cell array region CAR and the connection region CNR, etching the layered structure 100 using the mask pattern as an etch mask, etching the mask pattern to reduce a planar area of the mask pattern, and removing the mask pattern. The operations of etching the layered structure 100 and the mask pattern may be repeated several times before removing the mask pattern.

The uneven portion of the layered structure 100 may be removed by the trimming process, and thus, the mold structure 110 may be formed to expose the uneven top surface of the lower insulating layer 25 on the peripheral circuit region PCR. The mold structure 110 may be formed on the even top surface of the lower insulating layer 25, and thus, after the trimming process, the upper sacrificial layers SL may have top surfaces parallel to the top surface of the substrate 10. In addition, the mold structure 110 may have a stepwise decreasing thickness in a direction from the connection region CNR toward the peripheral circuit region PCR. During the trimming process for forming the mold structure 110, the top surface of the lower insulating layer 25, which is exposed by the lowermost one of the upper sacrificial layers SL, may be partially recessed.

The first etch stop layer, the dummy insulating layer, and the second etch stop layer may be partially etched during the trimming process for forming the mold structure 110. In this case, a first etch stop pattern 31, a dummy insulating pattern 33, and a second etch stop pattern 35 may be formed on the mold structure 110.

Figure 20:
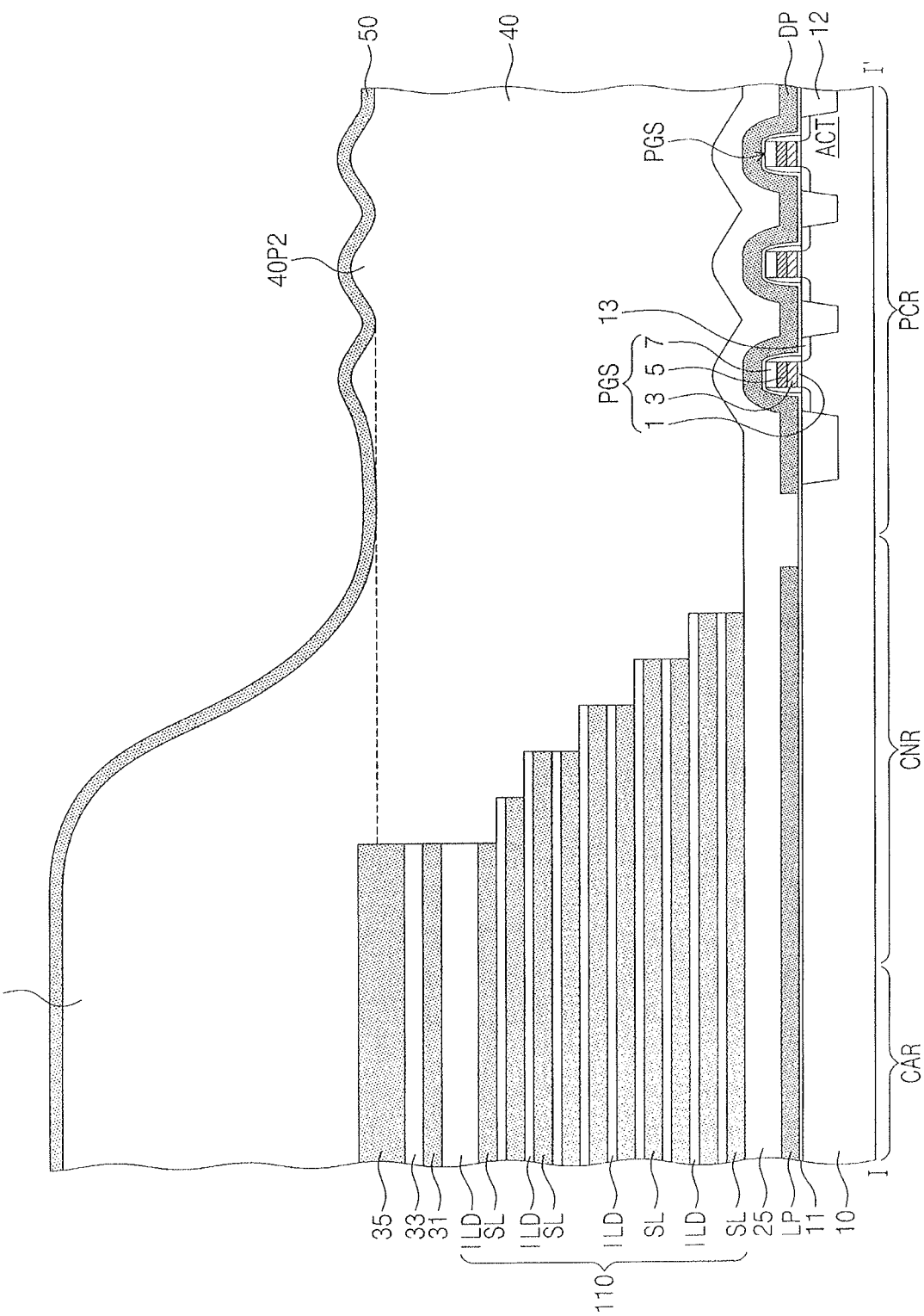

Referring to FIGS. 3 and 20, an insulating gapfill layer 40 may be deposited on the substrate 10. The insulating gapfill layer 40 may be formed to have a thickness larger than the thickness or height of the mold structure 110. A vertical level of a top surface of the insulating gapfill layer 40 may be lower on the peripheral circuit region PCR than on the cell array region CAR.

For example, the insulating gapfill layer 40 may be formed by a deposition process (for example, the CVD process), and in this case, the insulating gapfill layer 40 may have a first protruding portion 40P1, which is located on the cell array region CAR, and second protruding portions 40P2, which are located on the peripheral circuit region PCR and are positioned at a level lower than the first protruding portion 40P1. The insulating gapfill layer 40 may have an uneven top surface on the peripheral circuit region PCR, a substantially even top surface on the cell array region CAR, and an inclined top surface on the connection region CNR.

On the peripheral circuit region PCR, the lowermost top level of the insulating gapfill layer 40 may be positioned at a higher level than the bottom surface of the second etch stop pattern 35. On the peripheral circuit region PCR, the uppermost top level of the insulating gapfill layer 40 may be positioned at a higher level than the top surface of the second etch stop pattern 35.

The insulating gapfill layer 40 may be formed of an insulating material, and may be selected to have an etch selectivity with respect to the lower sacrificial pattern LP and the upper sacrificial layers SL. In some embodiments, the insulating gapfill layer 40 may be formed of an insulating material different from the lower insulating layer 25, and in this case, the insulating gapfill layer 40 may have an etch rate different from that of the lower insulating layer 25. For example, the insulating gapfill layer 40 may be formed of or include one or more of TEOS, PE-TEOS, $O_3$-TEOS, USG, PSG, BSG, BPSG, FSG, SOG, TOSZ, or any combination thereof. As an example, the insulating gapfill layer 40 may be formed of TEOS.

Thereafter, a polishing stop layer 50 may be conformally formed on the insulating gapfill layer 40. The polishing stop layer 50 may be formed of a material (for example, silicon nitride, silicon oxynitride, or silicon carbide), which is selected to have an etch selectivity with respect to the insulating gapfill layer 40.

Figure 21:
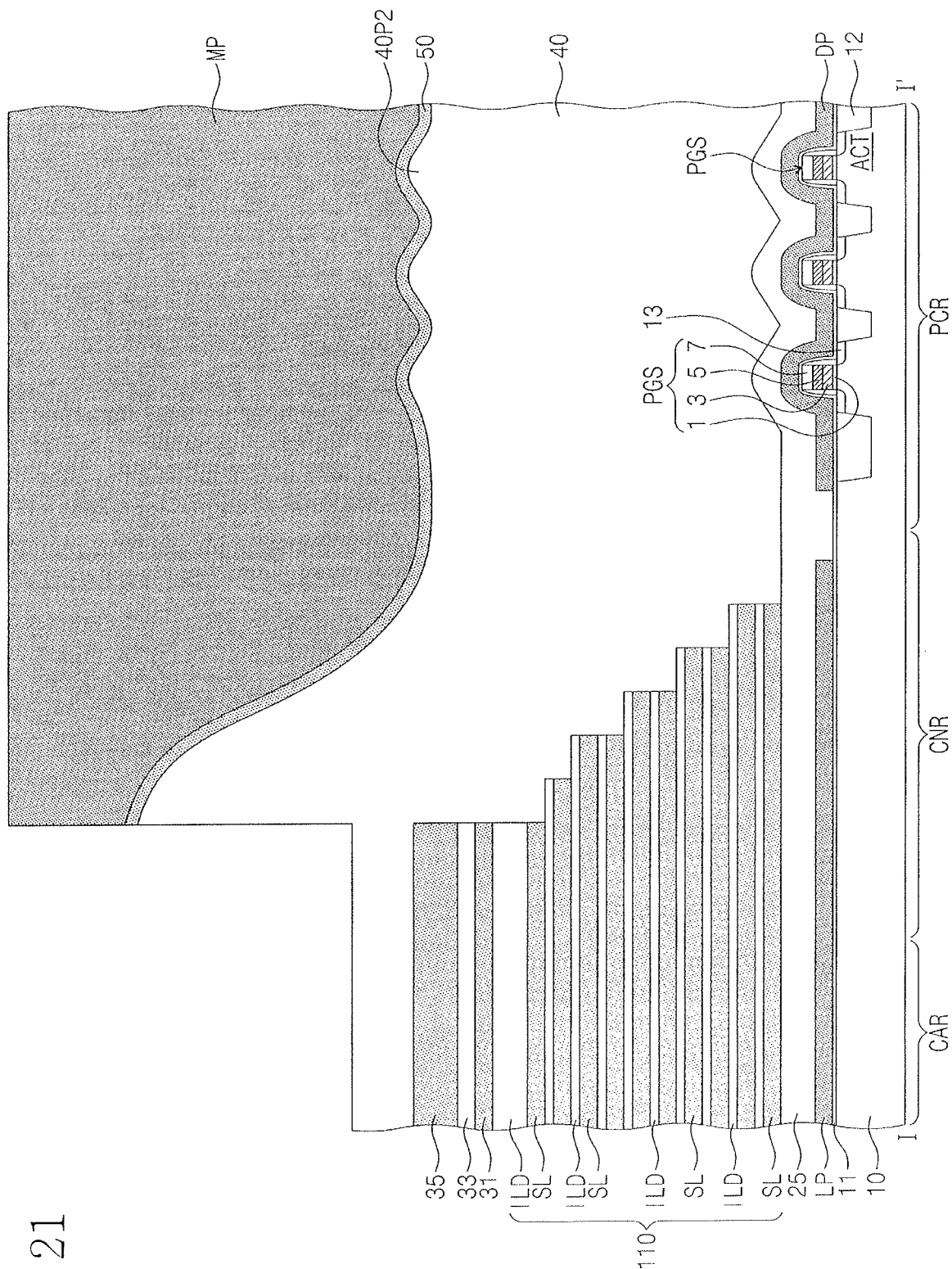

Referring to FIGS. 3 and 21, the insulating gapfill layer 40 may be patterned to remove the first protruding portion 40P1 from the cell array region CAR, and thus, it may be possible to reduce a height difference between two portions of the insulating gapfill layer 40 located on the cell array region CAR and the peripheral circuit region PCR.

The patterning of the insulating gapfill layer 40 may include forming a mask pattern MP on the polishing stop layer 50 to expose the cell array region CAR and etching the insulating gapfill layer 40 using the mask pattern MP as an etch mask. The first protruding portion 40P1 of the insulating gapfill layer 40 may be removed. Thus, the inclined portion of the insulating gapfill layer 40 may remain in a locally protruding shape on the connection region CNR. In some embodiments, the process of patterning the insulating gapfill layer 40 using the mask pattern MP may be omitted.

Figure 22:
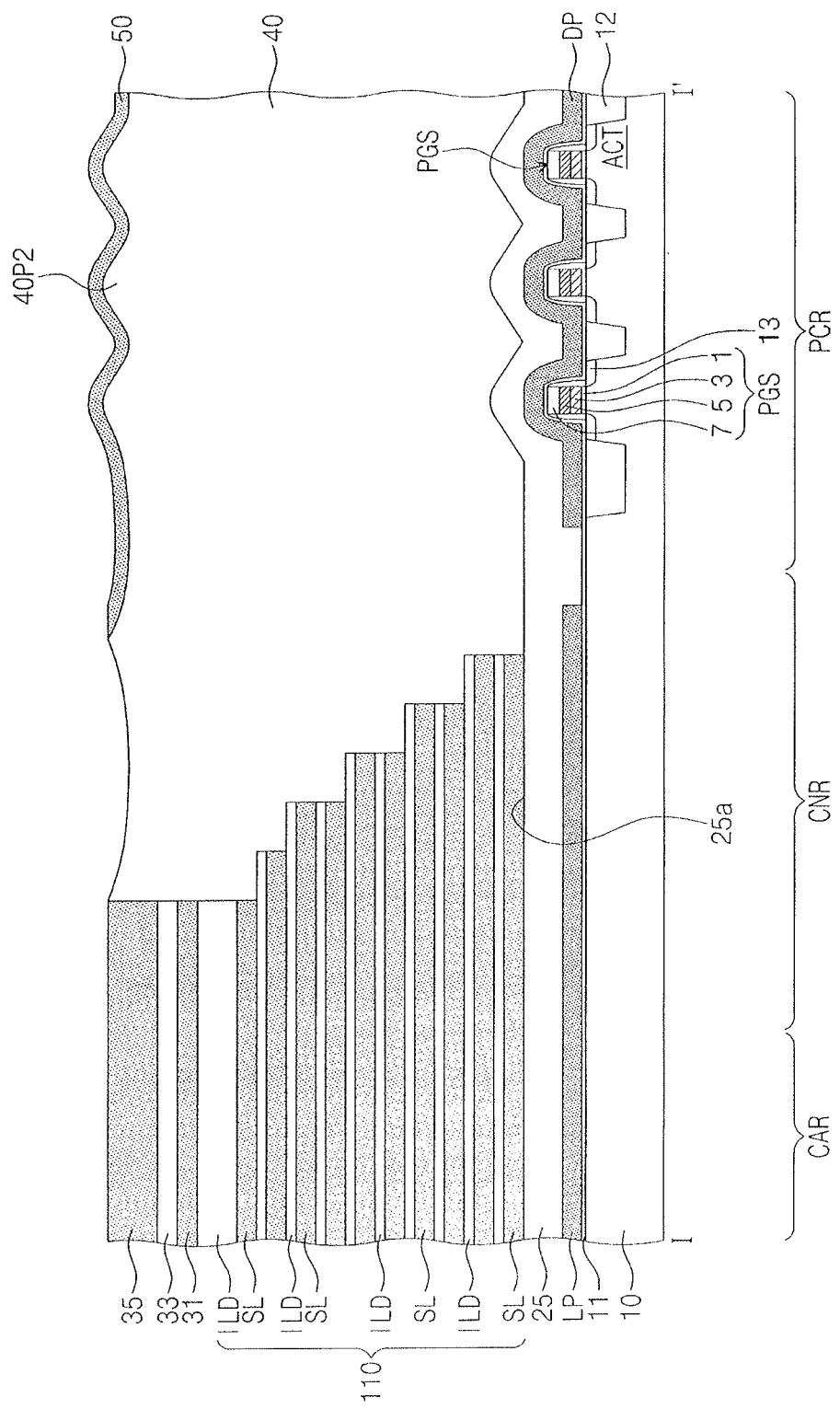

Referring to FIGS. 3 and 22, after the patterning of the insulating gapfill layer 40, a first planarization process may be performed on the insulating gapfill layer 40. In some embodiments, the first planarization process may include a chemical mechanical polishing (CMP) process, and the second etch stop pattern 35 on the cell array region CAR and at least a portion of the polishing stop layer 50 on the peripheral circuit region PCR may be used as a polishing stop point in the CMP process.

Figure 23:
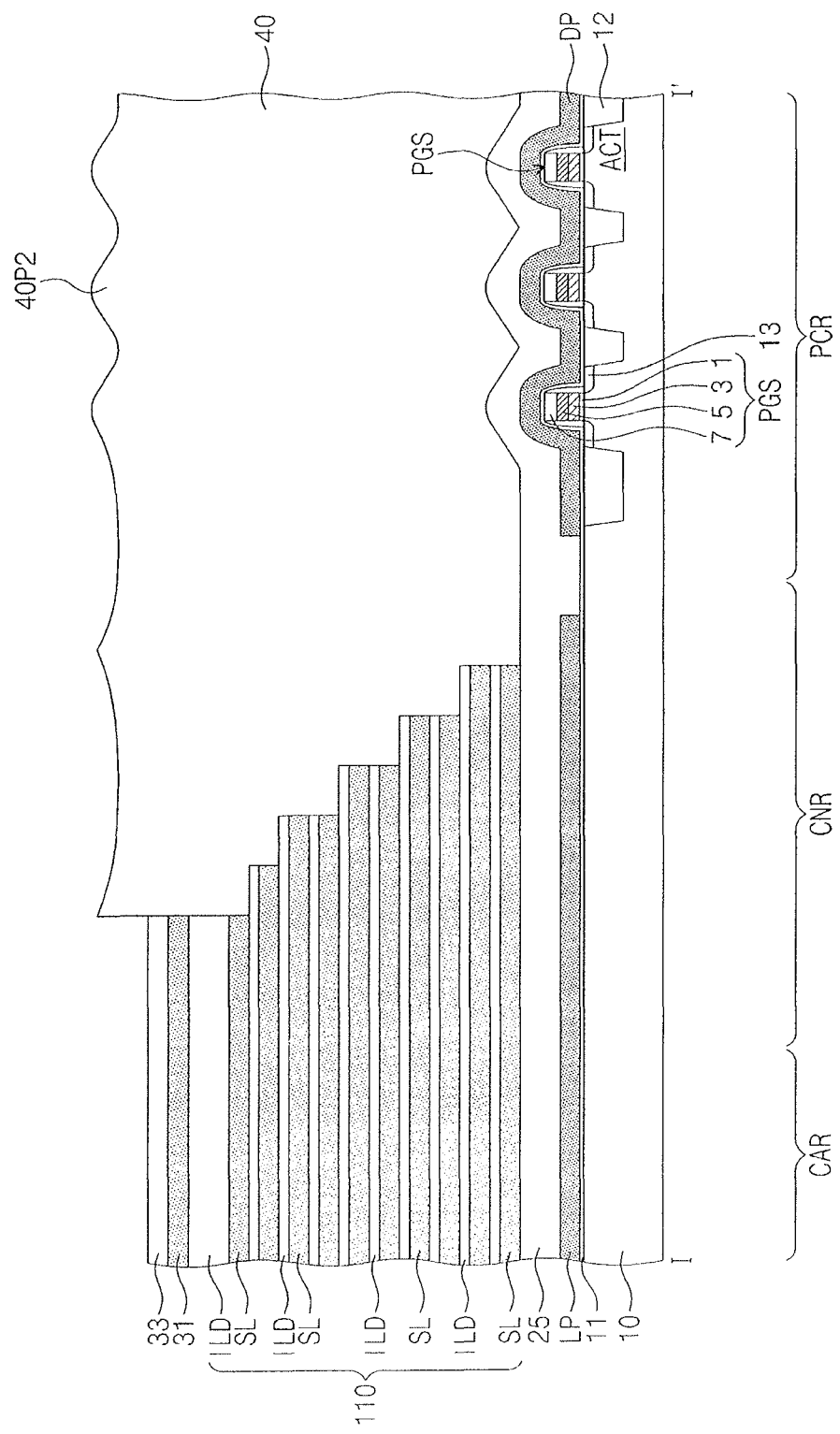

Referring to FIG. 23, after the first planarization process, a process may be performed to remove a portion of the polishing stop layer 50 that remains on the insulating gapfill layer 40, and to remove the second etch stop pattern 35. Accordingly, as shown in FIG. 23, top surfaces of the second protruding portions 40P2 of the insulating gapfill layer 40 may be exposed on the connection region CNR and the peripheral circuit region PCR, and the dummy insulating pattern 33 may be exposed on the cell array region CAR. For example, the second protruding portions 40P2 of the insulating gapfill layer 40 may remain on the peripheral circuit region PCR, after the first planarization process.

Figure 24:
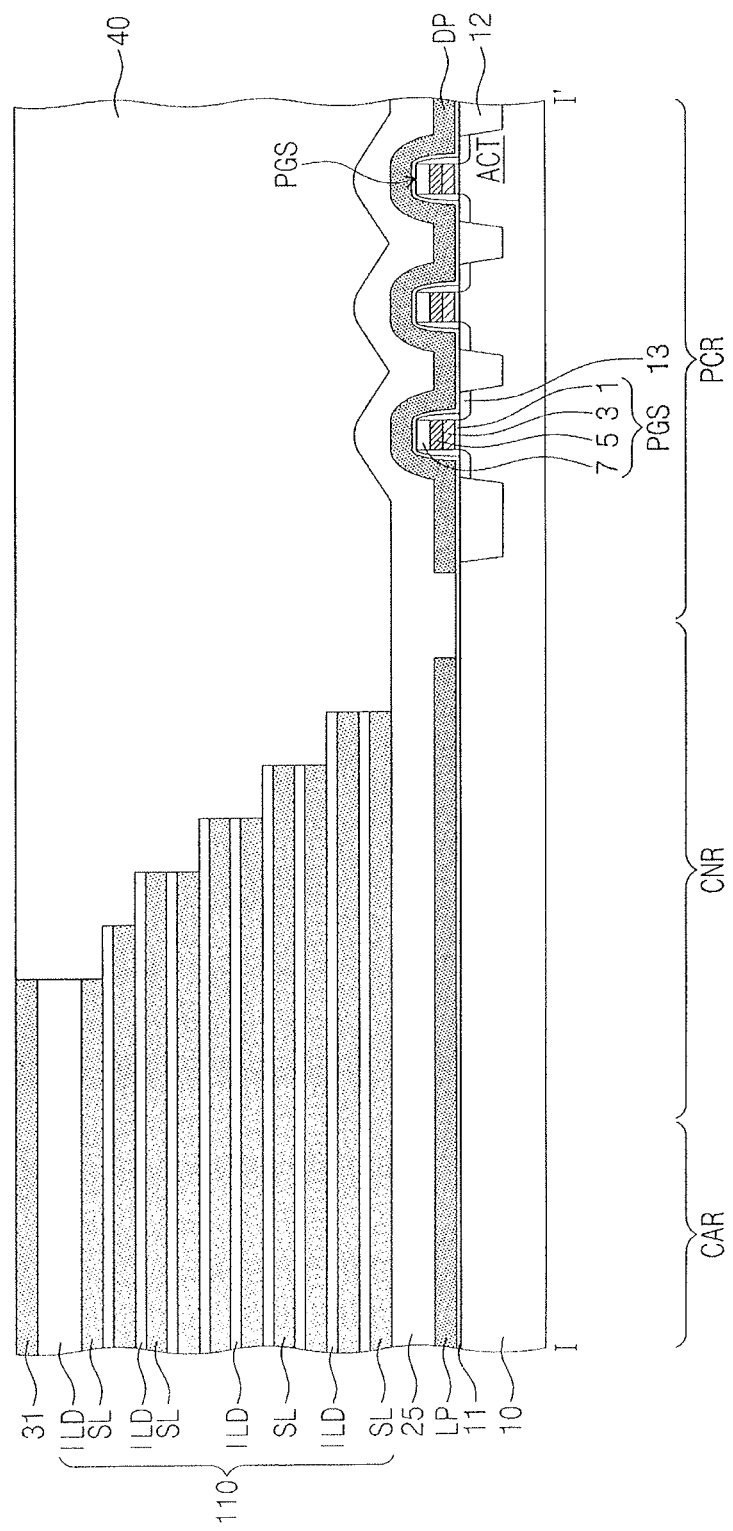

Referring to FIGS. 3 and 24, a second planarization process may be performed using the first etch stop pattern 31 as a planarization stop point. The second planarization process may include a CMP process. The lowermost top level of the insulating gapfill layer 40 on the peripheral circuit region PCR may be positioned at a higher level than the top surface of the first etch stop pattern 31. Thus, the second protruding portions 40P2 of the insulating gapfill layer 40 may be removed by the second planarization process. After the second planarization process, the insulating gapfill layer 40 on the connection region CNR and the peripheral circuit region PCR may have a substantially even top surface.

In some embodiments, the second planarization process may be or include a dry etching process performed on the insulating gapfill layer 40. Although the second protruding portions of the insulating gapfill layer 40 may be recessed by the dry etching process, the insulating gapfill layer 40 may have an uneven top surface on the peripheral circuit region PCR, as shown in FIG. 6.

Figure 25:
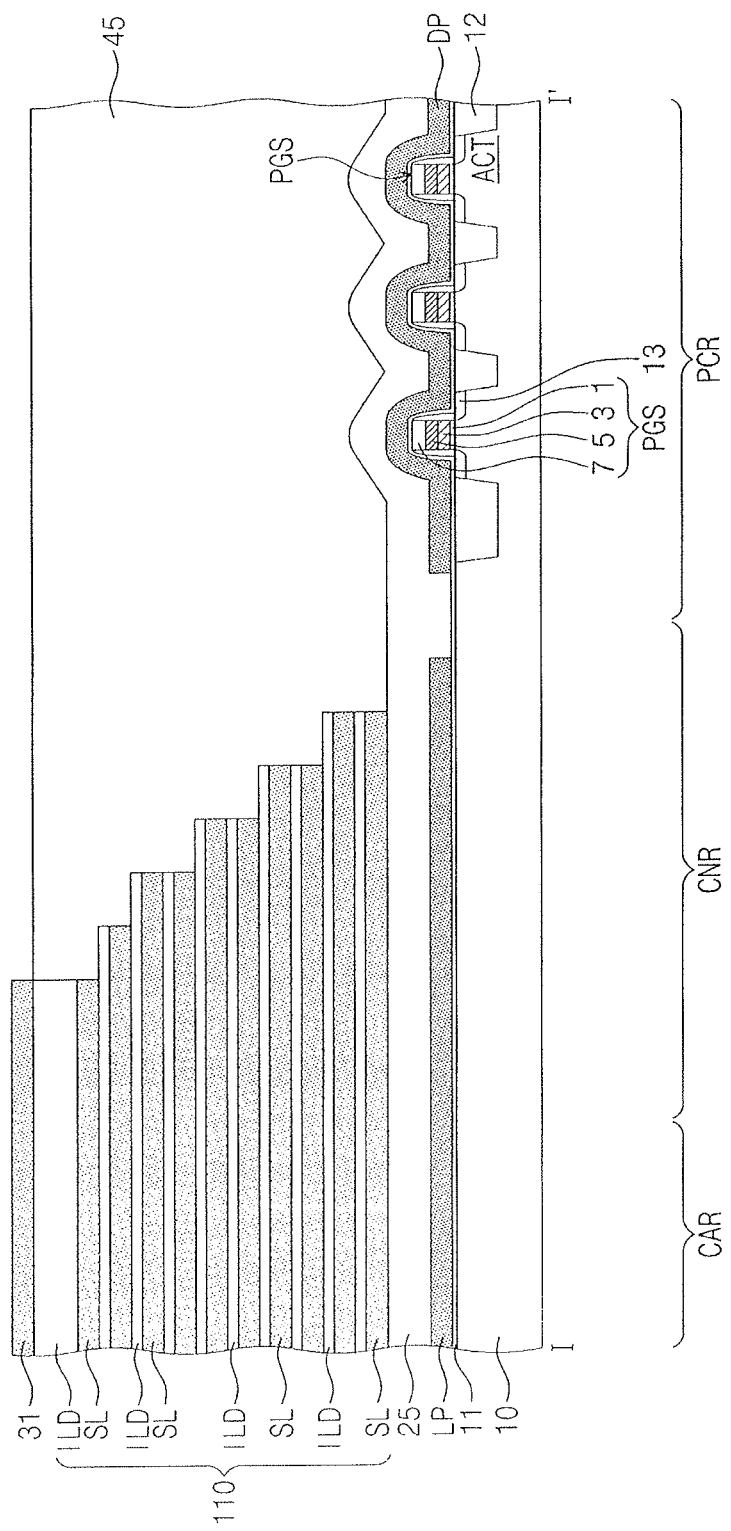

Referring to FIGS. 3 and 25, after the second planarization process, the planarized top surface of the insulating gapfill layer 40 may be recessed. As an example, a wet etching process using the first etch stop pattern 31 as an etch mask may be performed on the insulating gapfill layer 40. Accordingly, the planarized top surface of the insulating gapfill layer 40 may be positioned at substantially the same level as the top surface of the uppermost one of the upper insulating layers ILD. Next, the first etch stop pattern 31 may be removed. Accordingly, as shown in FIG. 25, the upper insulating gapfill layer 45 may be formed to have a substantially even top surface. In some embodiments, according to a position of the planarized top surface of the insulating gapfill layer 40, the wet etching process on the planarized insulating gapfill layer 40 may be omitted.

Figure 26:
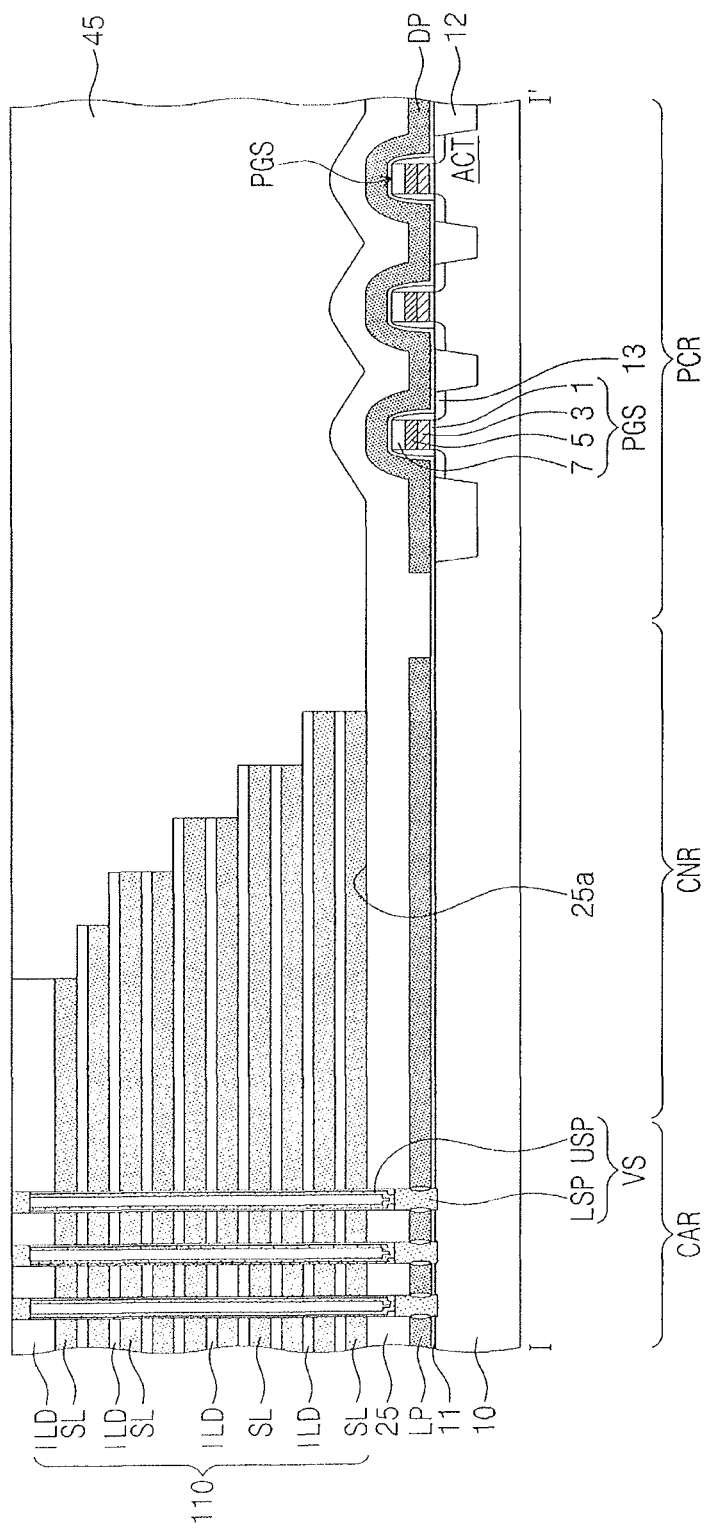

Referring to FIGS. 3 and 26, after the formation of the upper insulating gapfill layer 45, the vertical structures VS may be formed on the cell array region CAR to penetrate the mold structure 110, the lower insulating layer 25, the lower sacrificial pattern LP, and the buffer insulating layer 11.

The formation of the vertical structures VS may include forming vertical holes to penetrate the mold structure 110, the lower insulating layer 25, the lower sacrificial pattern LP, and the buffer insulating layer 11 and thereby to expose the substrate 10, and then forming the lower semiconductor pattern LSP and the upper semiconductor pattern USP in each of the vertical holes.

The lower semiconductor pattern LSP may be, for example, an epitaxial pattern formed by a selective epitaxial growth (SEG) process, and the substrate 10 exposed by the vertical holes may be used as a seed layer. A top surface of the lower semiconductor pattern LSP may be positioned at a higher level than that of the lower sacrificial pattern LP.

The upper semiconductor pattern USP may be formed in the vertical hole provided with the lower semiconductor pattern LSP. The upper semiconductor pattern USP may be in contact with the lower semiconductor pattern LSP. The upper semiconductor pattern USP may be formed by, for example, depositing a semiconductor layer to conformally cover inner surfaces of the vertical holes. In an implementation, the semiconductor layer may be formed to have a conformal thickness while being too thin to completely fill the vertical holes. Accordingly, the upper semiconductor patterns USP may define empty or gap regions, which are located in the vertical holes and are filled with an insulating gapfill layer or a gaseous material. A conductive pad may be formed on or in a top portion of each of the upper semiconductor patterns USP. The conductive pad may be an impurity-doped region or may be formed of a conductive material.

Before the formation of the upper semiconductor pattern USP, the vertical insulating pattern VP may be formed in each of the vertical holes, as described with reference to FIGS. 5A and 5B. The formation of the vertical insulating pattern VP may include sequentially depositing a vertical insulating layer and a first semiconductor layer to conformally cover inner surfaces of the vertical holes provided with the lower semiconductor patterns LSP, and performing an anisotropic etching process on the vertical insulating layer and the first semiconductor layer until the lower semiconductor patterns LSP are partially exposed.

Figure 27:
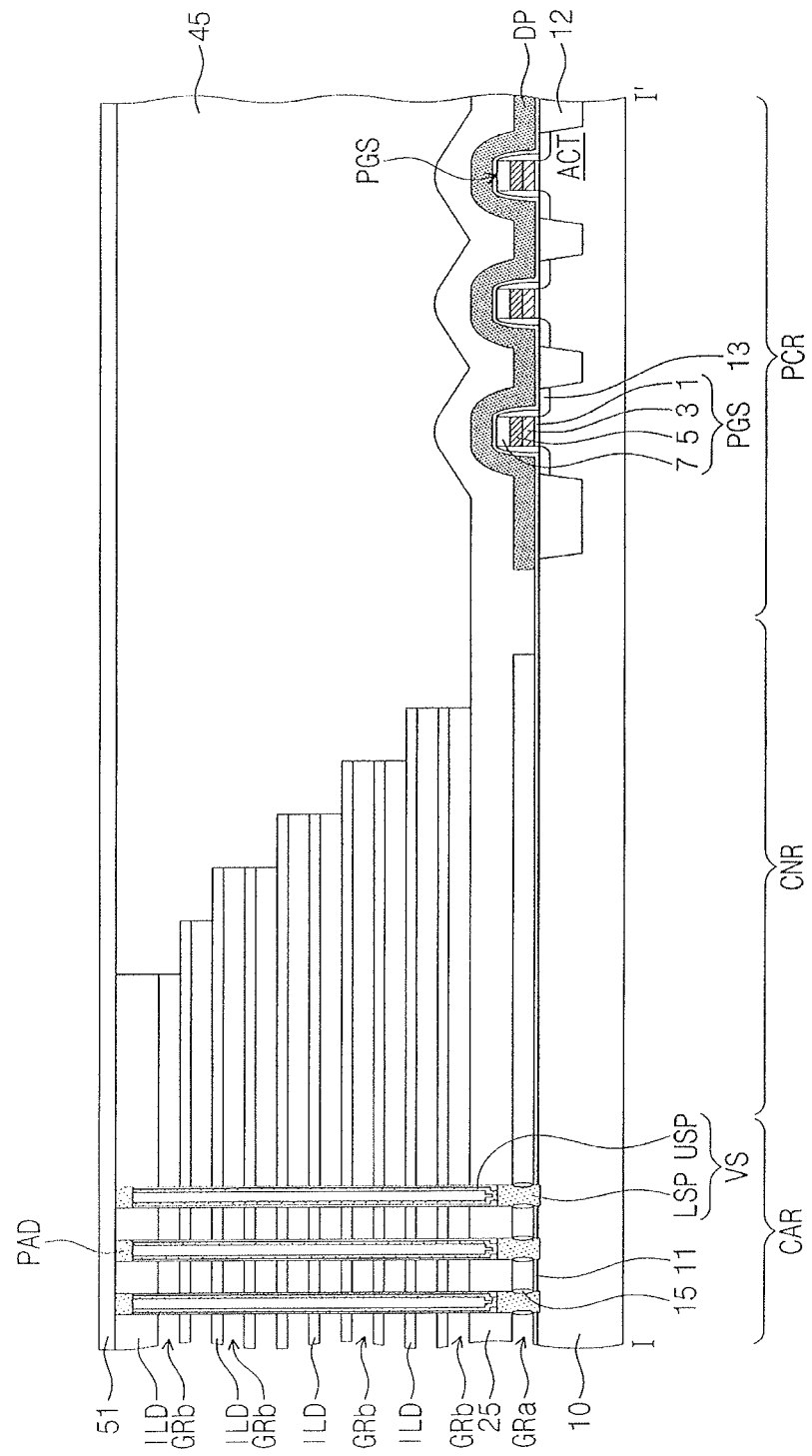

Referring to FIGS. 3 and 27, the first interlayered insulating layer 51 may be formed on the upper insulating gapfill layer 45 to cover the top surfaces of the vertical structures VS. After the formation of the first interlayered insulating layer 51, the electrode structure ST may be formed by a replacement process of replacing the lower sacrificial pattern LP with the lower electrode ELa and of replacing the upper sacrificial layers SL, which are exposed through trenches, with the upper electrodes ELb.

For example, referring to FIG. 27, after the formation of the first interlayered insulating layer 51, the first interlayered insulating layer 51, the upper insulating gapfill layer 45, the mold structure 110, the lower insulating layer 25, and the lower sacrificial pattern LP may be patterned to form trenches exposing the substrate 10. When viewed in a plan view, the trenches may be shaped like a line extending in the first direction D1 or a letter 'H'. The trenches may be spaced apart from the vertical structures VS and may be formed to expose side surfaces of the upper sacrificial layers SL and the lower sacrificial pattern LP. After the formation of the trenches, the common source regions CSR (for example, see FIG. 3) may be formed in portions of the substrate 10 exposed by the trenches.

For example, the upper sacrificial layers SL exposed by the trenches may be removed to form upper gate regions GRb, and the lower sacrificial pattern LP may be removed to form a lower gate region GRa. The lower and upper gate regions GRa and GRb may be formed by isotropically etching the upper sacrificial layers SL and the lower sacrificial pattern LP, and the isotropic etching process may be performed using an etch recipe that is selected to have an etch selectivity with respect to the buffer insulating layer 11, the lower insulating layer 25, the upper insulating layers ILD, the vertical structures VS, and the substrate 10. In some embodiments, the isotropic etching process may be performed to completely remove the upper sacrificial layers SL and the lower sacrificial pattern LP. In the case where the upper sacrificial layers SL and the lower sacrificial pattern LP are formed of silicon nitride and the buffer insulating layer 11, the lower insulating layer 25, the upper insulating layers ILD are formed of silicon oxide, the isotropic etching process may be performed using an etching solution containing phosphoric acid.

The upper gate regions GRb may be gap regions that are formed between vertically-adjacent ones of the upper insulating layers ILD and between the trench and the vertical structure VS. For example, each of the upper gate regions GRb may be formed to partially expose a sidewall of the vertical structure VS. The lower gate region GRa may be a gap region that is connected to the trench and is formed between the buffer insulating layer 11 and the first lower insulating layer 25 to partially expose a sidewall of the lower semiconductor pattern LSP.

Figure 28:
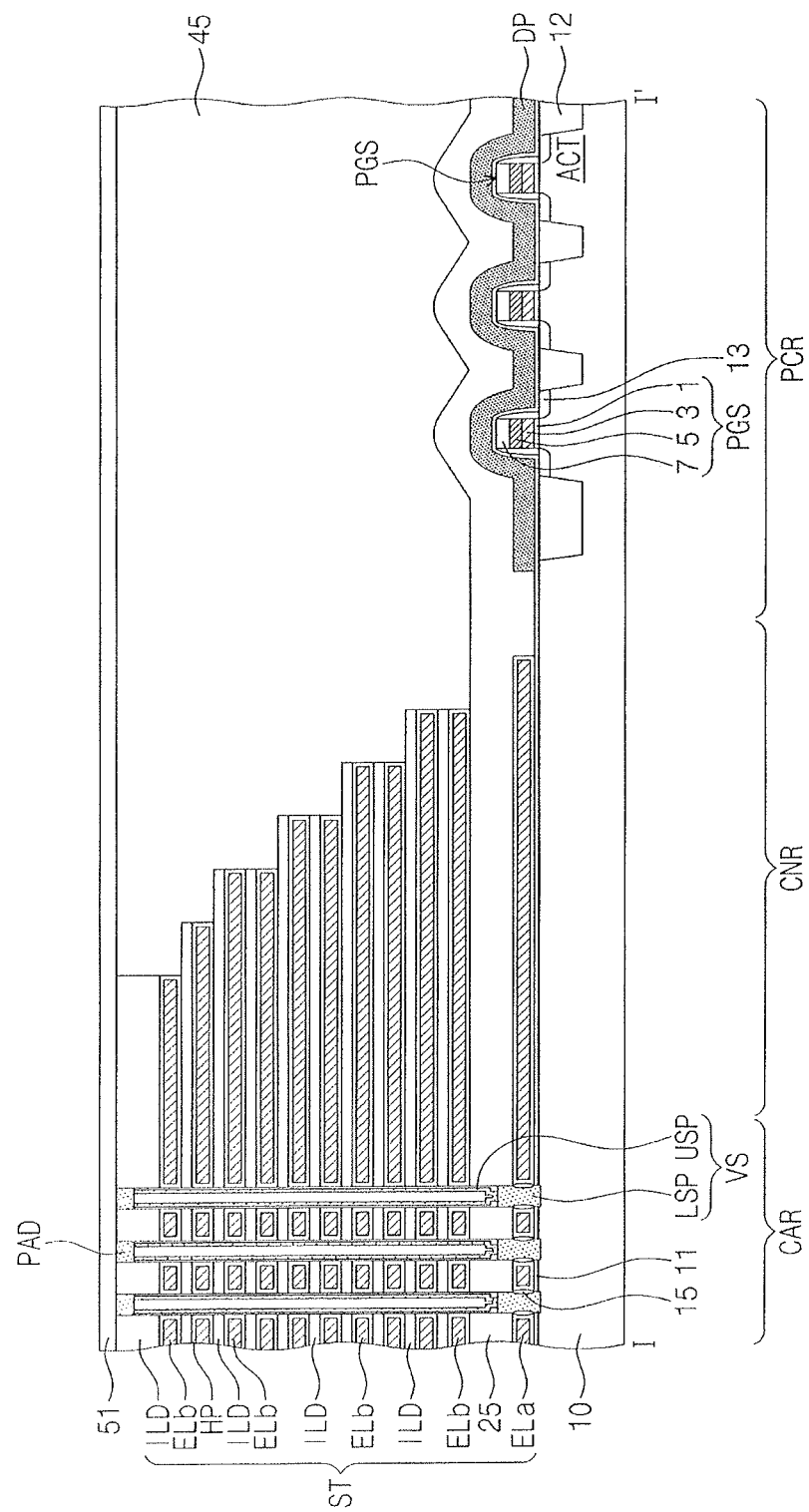

Referring to FIG. 28, the lower electrode ELa may be formed in the lower gate region GRa and the upper electrodes ELb may be formed in the upper gate regions GRb. The lower and upper electrodes ELa and ELb may be formed to partially or wholly fill the lower and upper gate regions GRa and GRb, respectively. The formation of the lower and upper electrodes ELa and ELb may include sequentially depositing a barrier metal layer and a metal layer.

Before the formation of the lower and upper electrodes ELa and ELb, the horizontal insulating pattern HP may be formed to conformally cover inner surfaces of the lower and upper gate regions GRa and GRb. The horizontal insulating pattern HP may serve as, for example, a part of a data storing layer of a NAND FLASH memory transistor. Before the formation of the horizontal insulating pattern HP, the gate insulating layer 15 may be formed on a side surface of the lower semiconductor pattern LSP exposed by the lower gate region GRa, and in some embodiments, the gate insulating layer 15 may be formed by a thermal oxidation process. As a result of the formation of the lower and upper electrodes ELa and ELb, the electrode structure ST may be formed on the cell array region CAR of the substrate 10, and the electrode structure ST may have the staircase structure on the connection region CNR.

Thereafter, as described with reference to FIG. 4, the second interlayered insulating layer 53 may be formed on the first interlayered insulating layer 51. Next, the contact plugs PLG, the cell contact plugs CPLG, and the peripheral contact plugs PPLG may be formed on the cell array region CAR, the connection region CNR, and the peripheral circuit region PCR, respectively.

Thereafter, the sub-bit lines SBL, the connection lines CL, and the peripheral lines PCL may be formed on the cell array region CAR, the connection region CNR, and the peripheral circuit region PCR, respectively. The third interlayered insulating layer 60 may be formed on the second interlayered insulating layer 53, and the bit lines BL may be formed on the third interlayered insulating layer 60.

By way of summation and review, for two-dimensional or planar semiconductor devices, the degree of integration is mainly determined by the area occupied by a unit memory cell. Thus, integration is greatly influenced by the level of a fine pattern forming technology but extremely expensive process equipment is needed to increase pattern fineness, which sets a practical limitation on increasing integration for two-dimensional or planar semiconductor devices. Thus, three-dimensional semiconductor memory devices including three-dimensionally arranged memory cells may be pursued.

As described above, example embodiments may provide a highly-reliable high density three-dimensional semiconductor memory device. Embodiments may also provide a method of improving productivity in a process of fabricating a three-dimensional semiconductor memory device.

According to some embodiments, a mold structure may be directly formed on a flat portion of a lower insulating layer, which is formed to cover a lower sacrificial layer on a cell array region and a peripheral circuit structure on a peripheral circuit region, without a planarization process on the lower insulating layer. This may make it possible to simplify a fabrication process of a three-dimensional semiconductor memory device. In addition, the lower insulating layer may be prevented from being damaged by the planarization process, and thus, it may be possible to improve product characteristics of the three-dimensional semiconductor memory device. In addition, a planarization process may be performed on an upper insulating gapfill layer, after the formation of the mold structure. In this planarization process, a plurality of etch stop layers may be used to prevent the upper insulating gapfill layer from being damaged.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor memory device, comprising:
   a substrate including a cell array region, a peripheral region, and a connection region located between the cell array region and the peripheral region;
   a stack structure provided on the substrate and having a staircase structure on the connection region, the stack structure including a first lower layer, a second lower layer covering the first lower layer, and first upper layers and second upper layers, which are vertically and alternately stacked on the second lower layer;
   a vertical channel structure penetrating the stack structure in the cell array region; and
   a gate structure provided on peripheral region of the substrate and adjacent to the staircase structure of the stack structure, the gate structure including a gate pattern, a gate spacer, and a buffer layer,
   wherein the gate spacer and the buffer layer are disposed on at least one surface of the gate pattern,
   wherein the second lower layer includes a first portion between the first lower layer and a lowermost one of the first upper layers, and a second portion on a side surface of the gate pattern, and
   wherein a top surface of the second portion is located at a higher level than a top surface of the first portion.

2. The device as claimed in claim 1, wherein the second portion of the second lower layer is positioned between a side surface of the lowermost one of the first upper layers and the side surface of the gate pattern.

3. The device as claimed in claim 1, further comprising an upper insulating gapfill layer that covers the stack structure and the second portion of the second lower layer,
   wherein the upper insulating gapfill layer is in direct contact with the top surface of the second portion of the second lower layer.

4. The device as claimed in claim 1, wherein the second portion of the second lower layer is positioned above a top surface of the lowermost one of the first upper layers.

5. The device as claimed in claim 1, wherein a difference in distance between lowermost and uppermost levels of the top surface of the second lower layer is larger than a thickness of each of the first upper layers.

6. The device as claimed in claim 1, wherein the gate pattern has a first thickness, the first lower layer has a second thickness smaller than the first thickness, and the second lower layer on the cell array region has a third thickness larger than the second thickness.

7. The device as claimed in claim 1, wherein each of the first upper layers has substantially a same thickness as that of the first lower layer.

8. The device as claimed in claim 1, further comprising an upper insulating gapfill layer that covers the stack structure and the second portion of the second lower layer,
   wherein the second lower layer includes a first insulating material, and the upper insulating gapfill layer includes a second insulating material that is different from the first insulating material.

9. The device as claimed in claim 1, wherein the first portion of the second lower layer has a constant thickness.

10. The device as claimed in claim 1, further comprising impurity regions spaced apart from each other with the gate structure therebetween.

11. A three-dimensional semiconductor memory device, comprising:
    a first lower layer provided on a substrate;
    a stack structure provided on the first lower layer, the stack structure including first upper layers and second upper layers which are vertically and alternately stacked;
    a second lower layer disposed between the first lower layer and the stack structure, the second lower layer having a larger thickness than the second upper layers; and
    a gate structure provided on the substrate and having a side surface adjacent to the second lower layer, the gate structure including a gate pattern, a gate spacer, and a buffer layer,
    wherein the gate spacer and the buffer layer are disposed on at least one surface of the gate pattern,
    wherein the second lower layer includes a first portion between the first lower layer and a lowermost one of the first upper layers, and a second portion on the side surface of the gate pattern, and
    wherein a top surface of the second portion of the second lower layer is located at a higher level than a bottom surface of the lowermost one of the first upper layers.

12. The device as claimed in claim 11, wherein the second portion of the second lower layer is positioned above a top surface of the lowermost one of the first upper layers.

13. The device as claimed in claim 11, wherein the second portion of the second lower layer is positioned between a side surface of the lowermost one of the first upper layers and the side surface of the gate pattern.

14. The device as claimed in claim 11, further comprising an upper insulating gapfill layer that covers the stack structure and the second portion of the second lower layer,
wherein the upper insulating gapfill layer is in direct contact with the top surface of the second portion of the second lower layer.

15. The device as claimed in claim 11, wherein the gate pattern has a first thickness, the first lower layer has a second thickness smaller than the first thickness, and the second lower layer on a cell array region has a third thickness larger than the second thickness.

16. The device as claimed in claim 11, further comprising a plurality of vertical structures penetrating the stack structure, the first lower layer, and the second lower layer, the plurality of vertical structures being connected to the substrate.

17. A three-dimensional semiconductor memory device, comprising:
a substrate including a cell array region, a peripheral region, and a connection region located between the cell array region and the peripheral region;
a stack structure provided on the substrate and having a staircase structure in the connection region, the stack structure including a first lower layer, a second lower layer covering the first lower layer, and first upper layers and second upper layers, which are vertically and alternately stacked on the second lower layer;
a vertical channel structure penetrating the stack structure in the cell array region;
an upper insulating gapfill layer that is on the second lower layer and covers the stack structure;
a contact plug connected to the first upper layers through the upper insulating gapfill layer in the connection region;
a gate structure provided on a peripheral region of the substrate and adjacent to the staircase structure of the stack structure, the gate structure including a gate pattern, a gate spacer, and a buffer layer,
wherein the gate spacer and the buffer layer are disposed on at least one surface of the gate pattern,
wherein the second lower layer includes a first portion between the first lower layer and a lowermost one of the first upper layers, and a second portion on a side surface of the gate pattern, and
wherein a top surface of the second portion of the second lower layer is located at a higher level than a bottom surface of the lowermost one of the first upper layers.

18. The device as claimed in claim 17, wherein the second portion of the second lower layer is positioned above a top surface of the lowermost one of the first upper layers.

19. The device as claimed in claim 17, wherein the second portion of the second lower layer is positioned between a side surface of the lowermost one of the first upper layers and the side surface of the gate pattern.

20. The device as claimed in claim 17, wherein the gate pattern has a first thickness, the first lower layer has a second thickness smaller than the first thickness, and the second lower layer on the cell array region has a third thickness larger than the second thickness.

* * * * *